United States Patent
Son et al.

(10) Patent No.: US 11,244,926 B2
(45) Date of Patent: Feb. 8, 2022

(54) SEMICONDUCTOR PACKAGE AND MANUFACTURING METHOD THEREOF

(71) Applicant: SAMSUNG ELECTRONICS CO., LTD., Suwon-si (KR)

(72) Inventors: Young-Hoon Son, Hwaseong-si (KR); Jung-Hwan Choi, Hwaseong-si (KR); Seok-Hun Hyun, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 28 days.

(21) Appl. No.: 16/105,202

(22) Filed: Aug. 20, 2018

(65) Prior Publication Data
US 2019/0189592 A1    Jun. 20, 2019

(30) Foreign Application Priority Data
Dec. 20, 2017 (KR) .......................... 10-2017-0175641

(51) Int. Cl.
*H01L 25/00* (2006.01)
*H01L 25/065* (2006.01)
(Continued)

(52) U.S. Cl.
CPC .......... *H01L 25/0657* (2013.01); *H01L 24/02* (2013.01); *H01L 24/20* (2013.01); *H01L 25/105* (2013.01); *H01L 24/13* (2013.01); *H01L 24/16* (2013.01); *H01L 2224/02379* (2013.01); *H01L 2224/12105* (2013.01); *H01L 2224/131* (2013.01); *H01L 2224/13124* (2013.01);
(Continued)

(58) Field of Classification Search
CPC ................. H01L 25/0657; H01L 24/02; H01L 2224/02379; H01L 2225/0651; H01L 2225/06517; H01L 2225/06541; H01L 2225/06565; H01L 2924/1434
See application file for complete search history.

(56) References Cited

U.S. PATENT DOCUMENTS

| 4,758,745 A | * | 7/1988 | Elgamal | ........ | G01R 31/318516 |
| | | | | | 326/16 |
| 4,802,132 A | * | 1/1989 | Ohsawa | ............... | G11C 7/1033 |
| | | | | | 365/189.02 |

(Continued)

FOREIGN PATENT DOCUMENTS

KR    10-2015-0085384 A    7/2015

OTHER PUBLICATIONS

Communication dated Jul. 11, 2019, from the Intellectual Property Office of Singapore in counterpart Application No. 10201809905Y.
(Continued)

*Primary Examiner* — Mounir S Amer
*Assistant Examiner* — Alexander Belousov
(74) *Attorney, Agent, or Firm* — Sughrue Mion, PLLC

(57) ABSTRACT

A semiconductor package includes a first layer including a first semiconductor chip and a first through via, a first redistribution layer disposed on a surface of the first layer, and including a first-first wiring and a second-first wiring, and a second layer including a second semiconductor chip, and stacked on the first layer. The first semiconductor chip includes a first-first buffer, and the first-first buffer is electrically connected between the first-first wiring and the second-first wiring.

19 Claims, 27 Drawing Sheets

(51) Int. Cl.
*H01L 23/00* (2006.01)
*H01L 25/10* (2006.01)

(52) U.S. Cl.
CPC ............... *H01L 2224/13139* (2013.01); *H01L 2224/13144* (2013.01); *H01L 2224/13147* (2013.01); *H01L 2224/13155* (2013.01); *H01L 2224/16227* (2013.01); *H01L 2224/211* (2013.01); *H01L 2224/2101* (2013.01); *H01L 2224/215* (2013.01); *H01L 2224/2105* (2013.01); *H01L 2225/0651* (2013.01); *H01L 2225/06517* (2013.01); *H01L 2225/06541* (2013.01); *H01L 2225/06565* (2013.01); *H01L 2924/00015* (2013.01); *H01L 2924/1434* (2013.01)

(56) References Cited

U.S. PATENT DOCUMENTS

| 5,317,698 | A | * | 5/1994 | Chan | ............... H03K 19/17744 326/47 |
| 9,263,105 | B2 | | 2/2016 | Jeon et al. | |
| 9,673,183 | B2 | | 6/2017 | Lim | |
| 2006/0076679 | A1 | * | 4/2006 | Batchelor | ............... H01L 24/02 257/737 |
| 2013/0037950 | A1 | | 2/2013 | Yu et al. | |
| 2014/0210108 | A1 | | 7/2014 | Park | |
| 2015/0108661 | A1 | | 4/2015 | Vincent | |
| 2015/0200186 | A1 | | 7/2015 | Park | |
| 2016/0155728 | A1 | | 6/2016 | Zhao et al. | |
| 2016/0329299 | A1 | | 11/2016 | Lin et al. | |
| 2017/0012031 | A1 | * | 1/2017 | Lim | ..................... H01L 25/18 |
| 2017/0092379 | A1 | | 3/2017 | Kim et al. | |
| 2017/0098629 | A1 | | 4/2017 | Liu et al. | |
| 2017/0110159 | A1 | | 4/2017 | Hamada | |
| 2017/0117251 | A1 | | 4/2017 | Khan et al. | |
| 2017/0141088 | A1 | * | 5/2017 | Zhai | .................... H01L 23/5389 |
| 2017/0256502 | A1 | | 9/2017 | Chen et al. | |

OTHER PUBLICATIONS

Communication dated Sep. 8, 2020, from the Intellectual Property Office of German in counterpart Application No. 102018123839.8.

* cited by examiner

SEMICONDUCTOR PACKAGE AND MANUFACTURING METHOD THEREOF

CROSS REFERENCE TO THE RELATED APPLICATION

This application claims priority from Korean Patent Application No. 10-2017-0175641, filed on Dec. 20, 2017 in the Korean Intellectual Property Office, the disclosure of which is incorporated herein by reference in its entirety.

BACKGROUND

1. Field

Apparatuses and methods consistent with the example embodiments of the inventive concept relate to a semiconductor package, and more particularly, to a semiconductor package with fan-out packaging technology.

2. Description of the Related Art

Electronic products are demanding high-capacity data processing while decreasing their volume. Accordingly, there is a growing need to increase the degree of integration of semiconductor devices used in such electronic products. It is hard to stack more than four layers by a wire bonding process because of thickness of a semiconductor package.

Recently, PLP (Panel Level Package) and WLP (Wafer Level Package) technologies capable of increasing the integration degree and improving the unit cost have been researched and developed. However, in the case of a fan-out package having a stack structure, there is a limit on the number of stacks due to increase of load between a plurality of layers.

SUMMARY

Example embodiments provide a semiconductor package that applies a fan-out packaging technology and includes a stack structure capable of reducing a load between multiple layers. Example embodiments provide a method of manufacturing the semiconductor package.

According to example embodiments, there is provided a semiconductor package which may include: a first layer including a first semiconductor chip and a first through via; a first redistribution layer disposed on a surface of the first layer, and including a first-first wiring and a second-first wiring; and a second layer including a second semiconductor chip, and stacked on the first layer. The first semiconductor chip may include a first-first buffer, and the first-first buffer may be electrically connected between the first-first wiring and the second-first wiring.

According to example embodiments, there is provided a semiconductor package which may include a plurality of layers. Two or more of the layers may include respective semiconductor chips insulated from one another, and redistribution layers respectively disposed on the semiconductor chips. Each semiconductor chip may include two or more pads connected to one another by a plurality of wirings included in a corresponding redistribution layer, one of the pads being an input/output pad of a corresponding semiconductor chip. A first-first wiring included in a first redistribution layer disposed on a first layer, among the two or more layers, may be connected to an external input/output terminal. The first redistribution layer may further include a second-first wiring, connected to the input/output pad of a first semiconductor chip included in the first layer, and at least one buffer connecting the first-first wiring and the second-first wiring by being disposed therebetween.

According to example embodiments, there is provided a semiconductor package which may include a plurality of layers which are vertically stacked. Two or more of the layers may include respective semiconductor chips insulated from one another, and redistribution layers respectively disposed on the semiconductor chips. Each of the respective layers may include a plurality of wirings and a same number of buffers connecting the wirings, and the wirings may be connected to a pad included in a corresponding semiconductor chip of a corresponding layer.

According to example embodiments, there is provided a method of manufacturing a semiconductor package which may include: forming a first layer including a first through via and a first semiconductor chip including a first-first buffer; forming a first redistribution layer including a first-first wiring and a second-first wiring on a surface of the first layer; stacking a second layer on the first layer, the second layer including a second through via and a second semiconductor chip; and bonding an external connection terminal electrically connected to the first-first wiring. The first-first buffer may be electrically connected between the first-first wiring and the second-first wiring.

According to the semiconductor packages of the example embodiments, by a buffer of a semiconductor chip in a first layer, a load is separated from the inside and outside of the semiconductor package, so that the load may be distributed or reduced as compared with the case when no buffer exists between an external connection terminal and input/output pads of the semiconductor chips.

In addition, unlike a wire bonding package structure, the semiconductor package has a laminated structure of through vias, and multi-stacking is possible without increasing a load since the load is distributed or reduced by the buffer of the semiconductor chip.

In addition, it is possible to appropriately design positions of the through vias and wiring structure of the redistribution layer for each layer so as not to use or use the buffer in the semiconductor chip, and thus, a desired circuit can be constituted.

In addition, the number of buffers passing through the input/output pads of the semiconductor chip can be adjusted for each layer, so that delay difference for each layer can be reduced.

It is to be understood that both the foregoing general description and the following detailed description are exemplary and explanatory and are intended to provide further explanation of the invention as claimed.

BRIEF DESCRIPTION OF THE DRAWINGS

Example embodiments will be more clearly understood from the following detailed description taken in conjunction with the accompanying drawings.

FIGS. 1 to 15 represent non-limiting, example embodiments as described herein.

FIG. 1 is a cross-sectional view illustrating a semiconductor package 100 according to example embodiments.

FIG. 3 illustrates a connection relationship between a first redistribution layer RDL1, a second redistribution layer RDL2, and a third redistribution layer RDL3 of the semiconductor package 100 of FIG. 1, according to example embodiments.

FIG. 4 is a plan view illustrating the first redistribution layer RDL1, the second redistribution layer RDL2, and the third redistribution layer RDL3 in FIG. 3, respectively, according to example embodiments.

FIG. 6 illustrates a connection relationship between a first redistribution layer RDL 1, a second redistribution layer RDL 2, and a third redistribution layer RDL 3 of a semiconductor package according to example embodiments.

FIG. 7 is a plan view illustrating the first redistribution layer RDL1, the second redistribution layer RDL2, and the third redistribution layer RDL3 in FIG. 6, respectively, according to example embodiments.

FIG. 8 illustrates a connection relationship between a first redistribution layer RDL1, a second redistribution layer RDL2, and a third redistribution layer RDL3 of a semiconductor package according to example embodiments.

FIG. 9 is a plan view illustrating the first redistribution layer RDL1, the second redistribution layer RDL2, and the third redistribution layer RDL3 in FIG. 8, respectively, according to example embodiments.

FIG. 10 is a cross-sectional view illustrating a semiconductor package 200 according to example embodiments.

FIG. 12 illustrates a connection relationship between a first redistribution layer RDL1, a second redistribution layer RDL2, and a third redistribution layer RDL3 of the semiconductor package 200 of FIG. 10, according to example embodiments.

FIG. 13 is a plan view illustrating the first redistribution layer RDL1, the second redistribution layer RDL2, and the third redistribution layer RDL3 in FIG. 12, respectively, according to example embodiments.

FIG. 14 is a cross-sectional view illustrating a semiconductor package 300 according to example embodiments.

FIG. 15 illustrates a connection relationship between a first redistribution layer RDL1, a second redistribution layer RDL2, and a third redistribution layer RDL3 of the semiconductor package 300 of FIG. 14, according to example embodiments.

DETAILED DESCRIPTION OF THE EXAMPLE EMBODIMENTS

Figure 1:
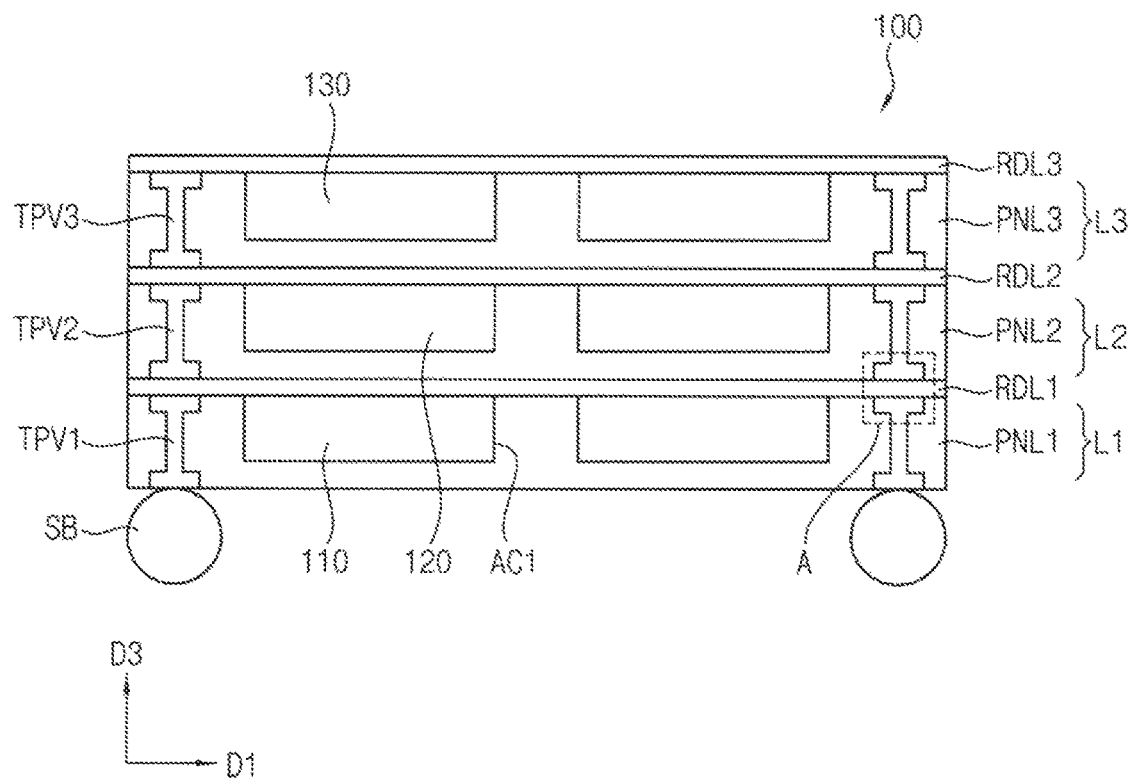

Various example embodiments of the inventive concept will be described more fully hereinafter with reference to the accompanying drawings. The inventive concept may, however, be embodied in many different forms and should not be construed as limited to the example embodiments set forth herein. Rather, these example embodiments are provided so that this description will be thorough and complete, and will fully convey the scope of the inventive concept to those skilled in the art. In the drawings, the sizes and relative sizes of layers and regions may be exaggerated for clarity.

It will be understood that, although the terms first, second, third, first-first, second-first, first-second, second-second, first-third, second-third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. Like numerals refer to like elements throughout. As used herein, the term "and/or" includes any and all combinations of one or more of the associated listed items.

Spatially relative terms, such as "beneath," "below," "lower," "over," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Figure 2A:
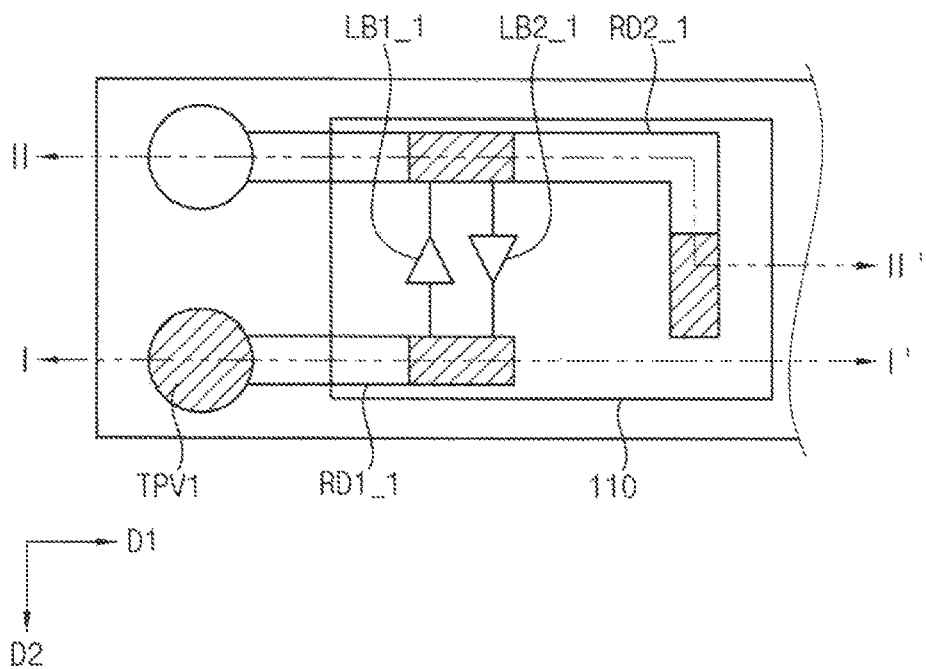
FIGS. 2A, 2B and 2C are respectively a plan view and cross-sectional views of a portion of a first layer L1 of the semiconductor package 100 of FIG. 1 including a first semiconductor chip 110, according to example embodiments.
Figure 2B:
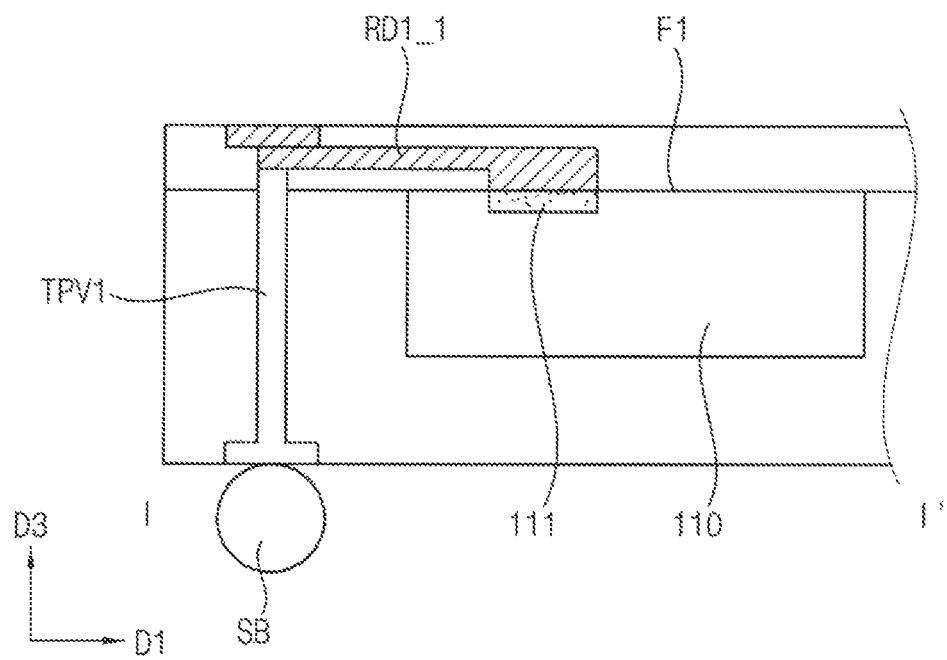
Figure 2C:
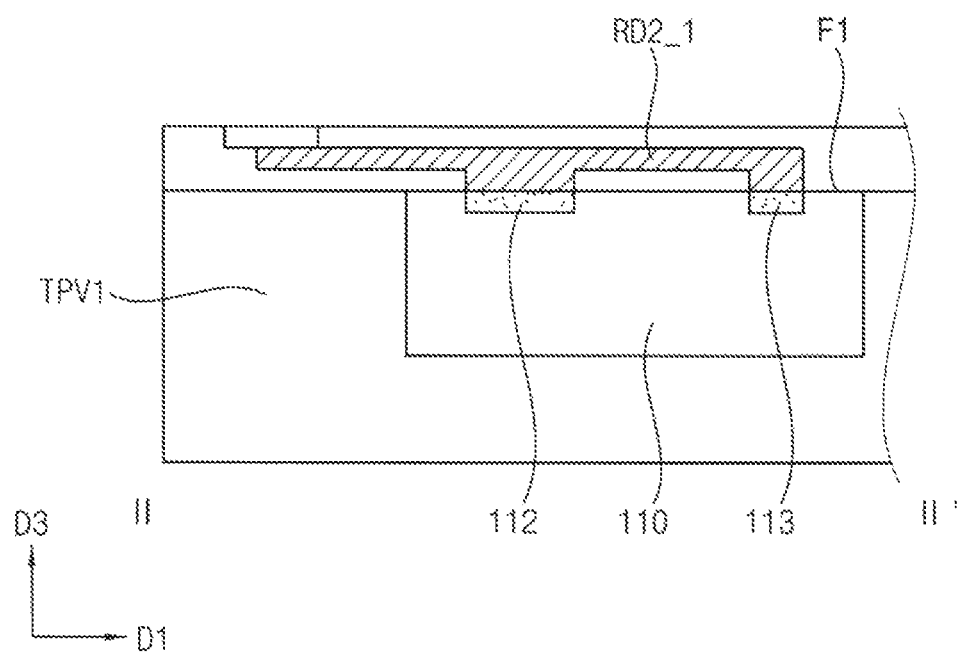

FIG. 1 is a cross-sectional view illustrating a semiconductor package 100 according to example embodiments. FIGS. 2A, 2B and 2C are respectively a plan view and cross-sectional views of a portion of a first layer L1 of the semiconductor package 100 of FIG. 1 including a first semiconductor chip 110, according to example embodiments.

Referring to FIGS. 1 and 2A to 2C, the semiconductor package 100 may include a first layer L1, a first redistribution layer RDL1, a second layer L2, a second redistribution layer RDL2, a third layer L3, a third redistribution layer RDL3, and an external connection terminal SB.

The first layer L1 may include at least one first semiconductor chip 110, at least one first TPV (Through Panel Via, TPV1), and a first panel PNL1 having a first receiving portion AC1 in which the first semiconductor chip 110 is received.

The second layer L2 may include at least one second semiconductor chips 210, at least one second TPV (Through Panel Via, TPV2), and a second panel PNL2 which has a second receiving portion in which the second semiconductor chip 210 is received.

The third layer L3 may include at least one third semiconductor chips 310, at least one third TPV (Through Panel Via, TPV3), and a third panel PNL3 which has a third receiving portion in which the third semiconductor chip 310 is received.

The first panel PNL1 may have an upper surface and a lower surface extending in a first direction D1 and a second direction D2 which is perpendicular to the first direction D1. The first receiving portion AC1 which receives the first semiconductor chip 110 may be formed at the upper surface of the first panel PNL1.

The second panel PNL2 may be stacked on the first panel PNL1 in a third direction D3 perpendicular to the first and second directions D1 and D2. The second receiving portion may be formed at an upper surface of the second panel PNL2.

The third panel PNL3 may be stacked on the second panel PNL2 in the third direction D3. The third receiving portion may be formed at an upper surface of the third panel PNL3.

In the example embodiments, each of the first panel PNL1, the second panel PNL2, and the third panel PNL2 may include an insulating substrate. The insulating substrate may include an insulating material, for example, silicon, glass, ceramic, plastic, or polymer. Each of the first panel PNL1, the second panel PNL2, and the third panel PNL3 may be formed in a flat plate shape, or may have various shapes such as a circular shape or a polygonal shape.

The first semiconductor chip 110 may be received at the first receiving portion AC1, and may include a first pad 111, a second pad 112 and a third pad 113 which may be formed on a first surface F1 of the first semiconductor chip 110.

The first to third pads 111, 112 and 113 may include metal. For example, the first to third pads 111, 112 and 113 may be plated pads formed by plating process, and may include Au, Ni/Au, or Ni/Pd/Au.

The first semiconductor chip 110 may further include a first-first buffer LB1_1, and a second-first buffer LB2_1.

One end of the first-first buffer LB1_1 may be electrically connected to the first pad 111, and the other end of the first-first buffer LB1_1 may be electrically connected to the second pad 112. Thus, the first-first buffer LB1_1 is electrically connected between the first pad 111 and the second pad 112, and the first-first buffer LB_1 can separate a load inside the semiconductor package 100 and a load outside the semiconductor package 100. The first-first buffer LB1_1 may be a bidirectional buffer.

One end of the second-first buffer LB2_1 may be electrically connected to the second pad 112, and the other end of the second-first buffer LB1_1 may be electrically connected to the first pad 111. Thus, the second-first buffer LB2_1 is electrically connected between the second pad 112 and the first pad 111. The second-first buffer LB2_1 may be a bidirectional buffer.

Figure 4:
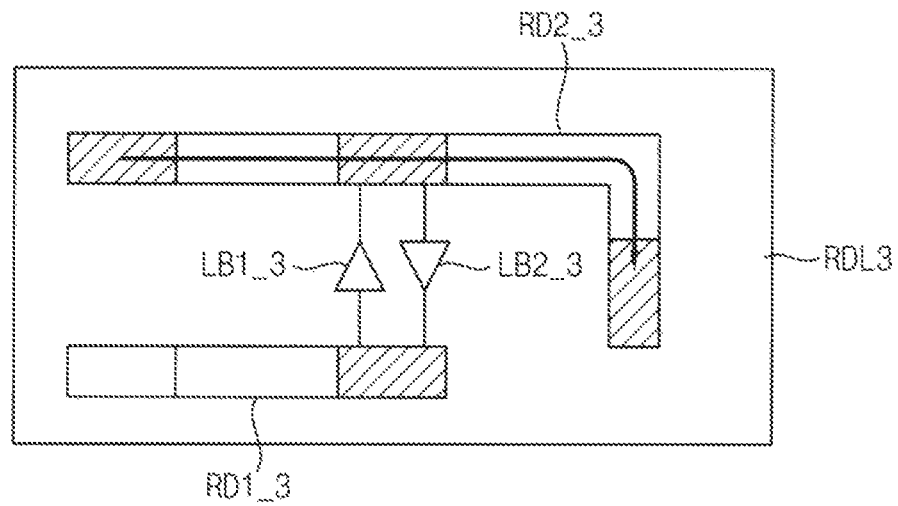
Figure 4:
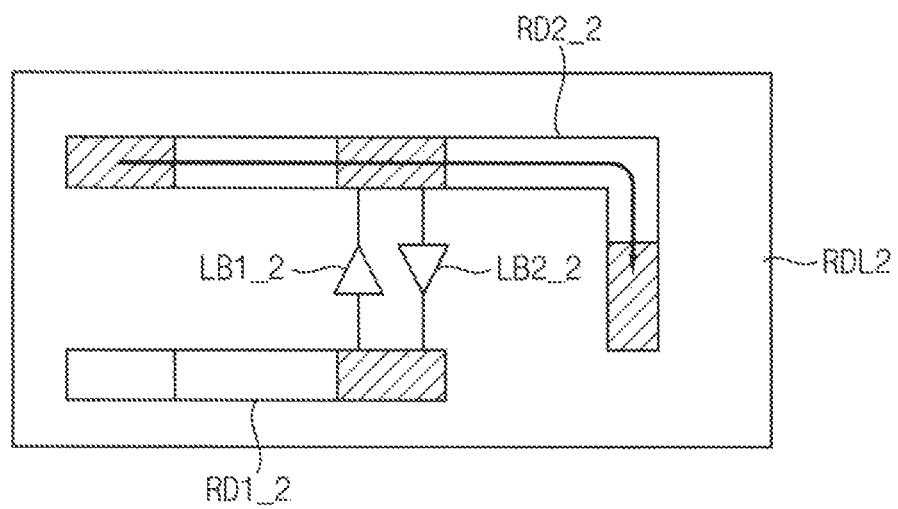
Figure 4:
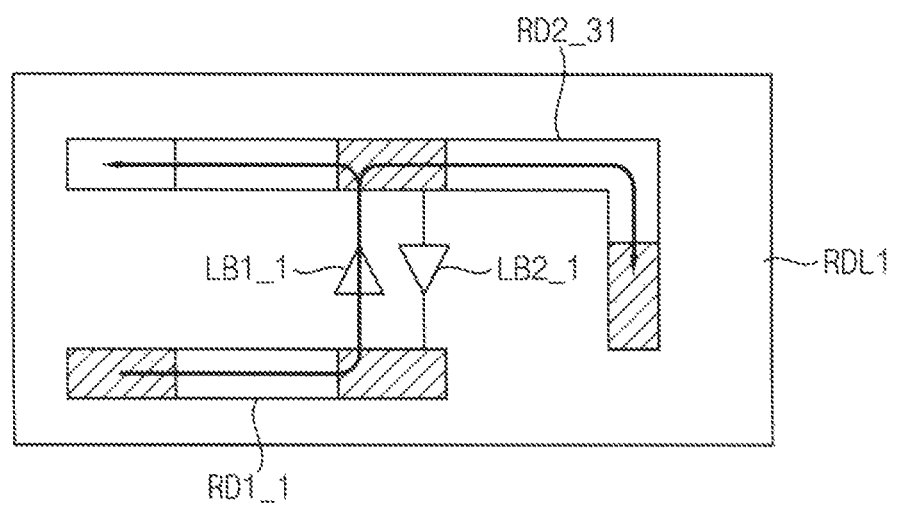

In the present example embodiment, the second-first buffer LB2_1 of the first semiconductor chip 110 is not used. However, in the second semiconductor chip 120 which is manufactured in the same process as that of the first semiconductor chip 110, a second buffer LB2_2 instead of a first buffer LB1_2 may be used as shown in FIG. 4 to be discussed later. Thus, according to the design of the semiconductor package 100, a necessary buffer among the first and second buffers LB1_1 and LB2_1 can be selected by using wiring of the redistribution layer and the TPV.

The second semiconductor chip 120 may be received in the second receiving portion, and may include a first pad, a second pad and a third pad. The first pad, the second pad and the third pad may be formed on a first surface of the second semiconductor chip 120. The first to third pads may include metal.

The second semiconductor chip 120 may further include a first-second buffer LB1_2 and a second-second buffer LB2_2.

One end of the first-second buffer LB1_2 may be electrically connected to the first pad, and the other end of the first-second buffer LB1_2 may be electrically connected to the second pad. Thus, the first-second buffer LB1_2 is electrically connected between the first pad and the second pad. The first-second buffer LB1_2 may be a bidirectional buffer.

One end of the second-second buffer LB2_2 may be electrically connected to the second pad, and the other end of the second-second buffer LB1_2 may be electrically connected to the first pad. Thus, the second-second buffer LB2_2 is electrically connected between the second pad and the first pad. The second-second buffer LB2_2 may be a bidirectional buffer.

In the present example embodiment, the first-second buffer LB1_2 and the second-second buffer LB2_2 of the second semiconductor chip 120 are not used. However, the first semiconductor chip 110 and the second semiconductor chip 120 may be manufactured in the same process. According to the design of the semiconductor package 100, a necessary buffer among the first and second buffers LB1_2 and LB2_2 (or none of them) can be selected by using wiring of the redistribution layer and the TPV.

The third semiconductor chip 310 may be received in the third receiving portion, and may include a first pad, a second pad and a third pad. The first pad, the second pad and the third pad may be formed on a first surface of the third semiconductor chip 130. The first to third pads may include metal.

The third semiconductor chip 130 may further include a first-third buffer LB1_3 and a second-third buffer LB2_3.

One end of the first-third buffer LB1_3 may be electrically connected to the first pad, and the other end of the first-third buffer LB1_3 may be electrically connected to the second pad. Thus, the first-third buffer LB1_3 is electrically connected between the first pad and the second pad. The first-third buffer LB1_3 may be a bidirectional buffer.

One end of the second-third buffer LB2_3 may be electrically connected to the second pad, and the other end of the second-third buffer LB1_3 may be electrically connected to the first pad. Thus, the second-third buffer LB2_3 is electrically connected between the second pad and the first pad. The second-third buffer LB2_3 may be a bidirectional buffer.

In the present example embodiment, the first-third buffer LB1_3 and the second-third buffer LB2_3 of the second semiconductor chip 120 are not used. However, the first semiconductor chip 110 and the second semiconductor chip 120 may be manufactured in the same process. According to the design of the semiconductor package, a necessary buffer among the first and second buffers LB1_2 and LB2_2 (or none of them) can be selected by using wiring of the redistribution layer and the TPV.

Each of the first semiconductor chip 110, the second semiconductor chip 210, and the third semiconductor chip 310 may be, for example, a volatile memory. More specifically, the volatile memory may be a dynamic random access memory (DRAM), a static random access memory (SRAM), a SDRAM, a rambus DRAM (RDRAM), and the like, but is not limited thereto. In addition, the first semiconductor chip 110 may be a logic chip, and may be, for example, a controller that controls memory chips.

In addition, each of the first semiconductor chip 110, the second semiconductor chip 210, and the third semiconductor chip 310 may be a nonvolatile memory. More specifically, the nonvolatile memory may be a EEPROM, a flash memory), a phase-change RAM (PRAM), a resistive RAM (RRAM), a ferroelectric RAM (FeRAM), a magnetic RAM (MRAM), a polymer RAM (PoRAM), a nano floating memory (NFGM), a molecular electronics memory device, an insulator resistance change memory, and the like, but is not limited thereto.

The first semiconductor chip 110, the second semiconductor chip 120 and the third semiconductor chip 130 may be the same semiconductor chips or different semiconductor chips. In addition, when one of the first layer L1, the second layer L2, and the third layer L3 includes a plurality of first semiconductor chips 110, second semiconductor chips 120, and/or third semiconductor chips 130, some of these semiconductor chips may be the same semiconductor chips, and the other of these semiconductor chips may be different semiconductor chips. The plurality of first semiconductor chips 110, the second semiconductor chips 120, or the third semiconductor chips 130 may be disposed adjacent to or in contact with each other along the first direction D1 and the second direction D2 in one of the first layer L1, the second layer L2, and the third layer L3.

The first to third redistribution layers RDL1, RDL2, and RDL3 may be stacked on the first to third layers L1, L2, and L3 through a redistribution process, respectively.

The first to third redistribution layers RDL1, RDL2 and RDL3 form a redistribution pattern on the first to third layers L1, L2 and L3, respectively, so that input/output terminals of the semiconductor chips 110, 120, and 130 can be miniaturized and the number of input/output terminals can be increased. Accordingly, fan-out structure may be embodied. In addition, the first through third redistribution layers RDL1, RDL2 and RDL3 form the redistribution pattern on the first through third layers L1, L2 and L3, respectively, to enable a fan-out structure, so that the semiconductor package 100 advantageous for high performance and high speed signal processing can be realized. Each of the first to third redistribution layers RDL1, RDL2 and RDL3 may include conductive wirings and an insulating layer suitably insulating the wirings.

The redistribution layer RDL1 may be disposed between the first layer L1 and the second layer L2. The redistribution layer RDL1 may include a first-first wiring RD1_1 and a second-first wiring RD2_1. The first-first and second-first wirings RD1_1 and RD2_1 may include a conductive material. The conductive material may include a metal, for example, copper (Cu), a copper alloy, aluminum (Al), or an aluminum alloy.

The first-first wiring RD1_1 may be electrically connected to the first pad 111 of the first semiconductor chip 110 and the first TPV TPV1. The second-first wiring RD2_1 may be electrically connected to the second pad 112 and the third pad 113 of the first semiconductor chip 110. In addition, the second-first wiring RD2_1 may be electrically connected to the second TPV TPV2 of the second layer L2.

Although not shown in detail, the first-first wiring RD1_1 and the first pad 111 can be connected to each other in various ways.

For example, the first pad 111 and the first-first wiring RD1_1 may be physically or electrically connected. In some example embodiments, an upper surface of the first pad 111 may contact with a lower surface of the first-first wiring RD1_1. In some example embodiments, the first pad 111 and the first-first wiring RD1_1 may be electrically connected by one or more bumps (not shown) disposed therebetween. For example, the bumps may include Cu, Au, Ni, Al, Ag or an alloy comprising at least one of these metals. In some example embodiments, they may be connected by a combination of protrusions and grooves formed on at least one of a surface of the first-first wiring RD1_1 and a surface of the first pad 111.

The semiconductor package 100 according to the present example embodiment may electrically connect chips using a TPV and a redistribution layer without wire bonding. Accordingly, it is not limited to the number of stacked layers and may have a thin thickness.

The second redistribution layer RDL2 may include a first-second wiring RD1_2 and a second-second wiring RD2_2. The third redistribution layer RDL2 may include a first-third wiring RD1_3 and a second-third wiring RD2_3. Detailed connection relations of the second redistribution layer RDL2 and the third redistribution layer RDL3 will be described later in the description of FIG. 3. The second redistribution layer RDL2 and the third redistribution layer RDL3 may also be formed in a similar manner to the redistribution layer RDL1.

The first TPV TPV1 may penetrate the first panel PNL1 of the first layer L1 in the third direction D3, and may be connected with the external connection terminal SB and the first-first wiring RD_1 of the redistribution layer RDL1.

In some example embodiments, the first TPV TPV1 may include at least one of copper (Cu) and tungsten (W). For example, the first TPV TPV1 may be at least one selected from the group consisting of Copper (Cu), copper (Cu), tin (CuSn), copper magnesium (CuMg), copper nickel (CuNi), copper zinc (CuZn), copper lead (CuPd), copper gold (CuAu), copper rhenium CuW), and tungsten (W) alloy, but is not limited to. For example, the first TPV TPV1 may be formed through electroless plating, electroplating, sputtering, or printing processes.

The second TPV TPV2 may penetrate the second panel PNL2 of the second layer L2 in the third direction D3, and may be electrically connected to the redistribution layer RDL1 and the second redistribution layer RDL2. The third TPV TPV3 may penetrate the third panel PNL3 of the third layer L3 in the third direction D3, and may be electrically connected to second redistribution layer RDL2 and the third redistribution layer DRL3. Detailed connection relations between the second and third TPV TPV2 and TPV3 and the redistribution layers will be described later in the description of FIGS. 3 and 4. The second TPV TPV2 and the third TPV TPV3 may also be formed in a similar manner to the first TPV TPV1.

The external connection terminal SB is an external input/output terminal, and may be a solder ball. The external connection terminal SB may be disposed under the semiconductor package 100. The external connection terminal SB may be electrically connected to the first TPV TPV1.

The semiconductor package 100 may be electrically connected to outside via the external connection terminal SB.

In the present example embodiment, the semiconductor package 100 is implemented as a panel level fan-out package, but it can be implemented as a wafer level package WLP as a fan-out package as well as a panel level fan-out package. In this case, the panel of each layer may be a wafer, and the TPV may be TSV (through silicon via).

Although not shown in the drawings, additional layers may be further stacked on the third layer L3. In some example embodiments, additional layers may further include devices such as capacitors or inductors. In addition, the additional layer may include the same or similar construction as the first to third layers L1 to L3, so that the semiconductor package 100 may further include additional semiconductor chips.

Figure 3:
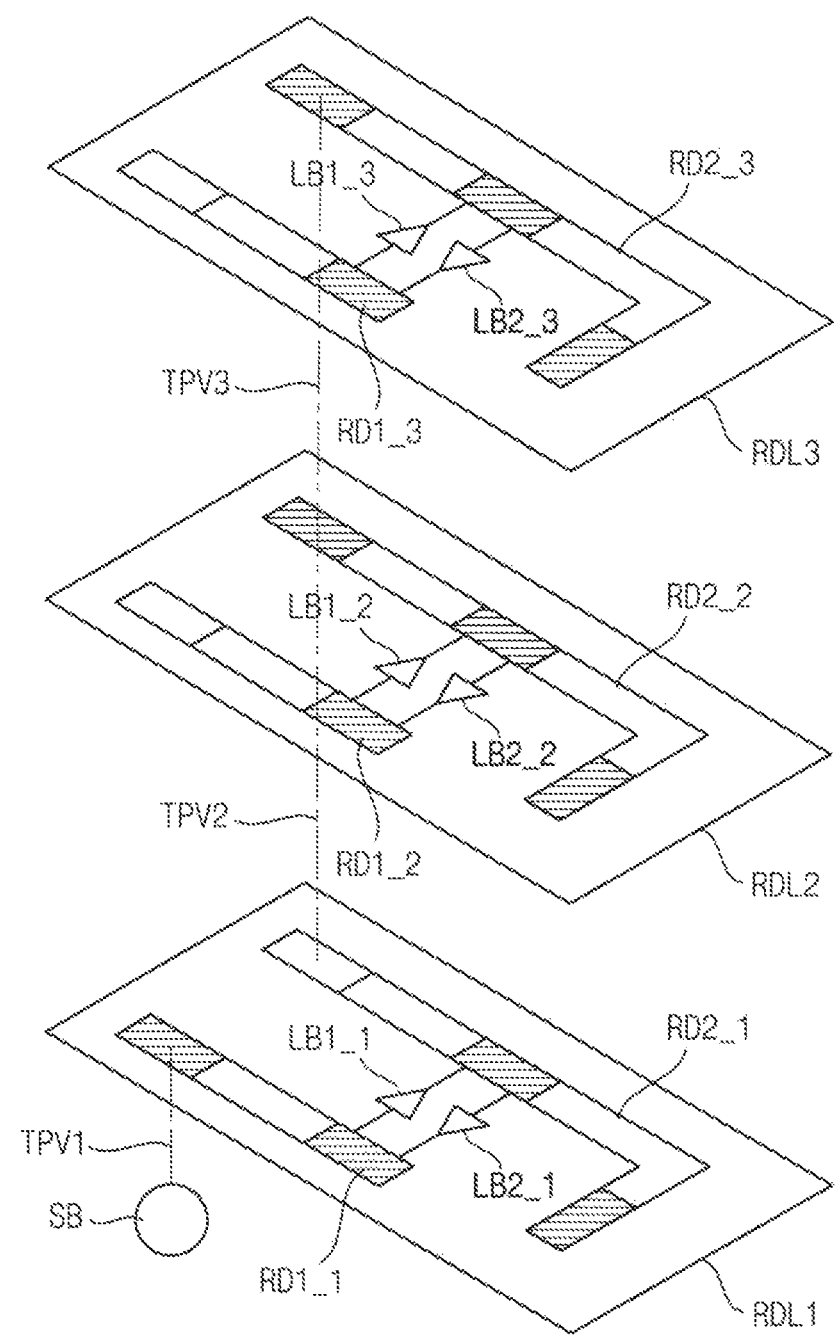

FIG. 3 illustrates a connection relationship between a first redistribution layer RDL1, a second redistribution layer RDL2, and a third redistribution layer RDL3 of the semiconductor package 100 of FIG. 1. FIG. 4 is a plan view illustrating the first redistribution layer RDL1, the second redistribution layer RDL2, and the third redistribution layer RDL3 in FIG. 3, respectively.

Referring to FIGS. 1 to 4, the external connection terminal SB may be electrically connected to the first TPV TPV1. The first TPV TPV1 may be electrically connected to the first-first wiring RD1_1 of the first redistribution layer RDL1. The first-first wiring RD1_1 may be electrically connected to the first-first buffer LB1_1 of the first semiconductor chip 110. The first-first buffer LB_1 may be electrically connected to the second-first wiring RD2_1. The second-first wiring RD2_1 may be electrically connected to the third pad 113, which is an input/output pad of the first semiconductor chip 110.

The second-first wiring RD2_1 may be electrically connected to the second TPV TPV2. The second TPV TPV2 may be electrically connected to the second-second wiring RD2_2 of the second redistribution layer RDL2. The second-second wiring RD2_2 may be electrically connected to the third pad, which is an input/output pad, of the second semiconductor chip 120.

The second-second wiring RD2_2 may be electrically connected to the third TPV TPV3. The third TPV TPV3 may be electrically connected to the second-third wiring RD2_3 of the third redistribution layer RDL3. The second-third wiring RD2_3 may be electrically connected to the third pad, which is an input/output pad, of the third semiconductor chip 130.

Here, the first TPV TPV1 and the second TPV TPV2 may be disposed at different positions on a plane formed by the first direction D1 and the second direction D2 so as not to overlap with each other. Thus, elements of the first layer L1 and the second layer L2 (the semiconductor chip, the redistribution layer, and the panel) may be formed in the same manner using the same process, and then the desired structure can be formed by laminating the layers while changing the position of the TPV.

FIG. 4 shows flow of signals input through the external connection terminals SB in the first to third redistribution layers RDL1, RDL2 and RDL3. By the first-first buffer LB1_1 of the first semiconductor chip 110, a load of the inside and a load of the outside of the semiconductor package 100 are separated, so that an entire load applied to the semiconductor package 100 may be distributed or reduced as compared with the case when no buffer exists between the external connection terminal SB and the input/output pads of the first to third semiconductor chips 110, 120, and 130.

In the present embodiment, since only the first-first buffer LB1_1 which is the buffer of the first layer L1 operates, a signal re-driven by the first-first buffer LB1_1 is shared by all the semiconductor chips. Thus, if the N layers are stacked, the maximum load can be N (max N loads).

The first-first buffer LB1_1 may be a bidirectional buffer, so that in the case of read/write, the semiconductor package 100 may operate similarly.

FIGS. 5A to 5E are enlarged cross-sectional views illustrating various example embodiments of 'A' portion of the semiconductor package 100 of FIG. 1.

Referring to FIGS. 1 to 5A, the first TPV1 and the first redistribution layer RDL1 may be electrically/physically connected to each other, and the first redistribution layer RDL1 and the second TPV TPV2 may be electrically/physically connected to each other. For example, an upper surface of the first TPV TPV1 may contact a lower surface of the first redistribution layer RDL1. In some example embodiments, the upper surface of the first TPV TPV1 may form substantially same plane as the lower surface of the first redistribution layer RDL1.

In addition, a lower surface of the second TPV TPV2 may contact the upper surface of the first redistribution layer RDL1. In some example embodiments, a lower surface of the second TPV TPV2 may form substantially same plane as the upper surface of the first redistribution layer RDL1.

Figure 5A:
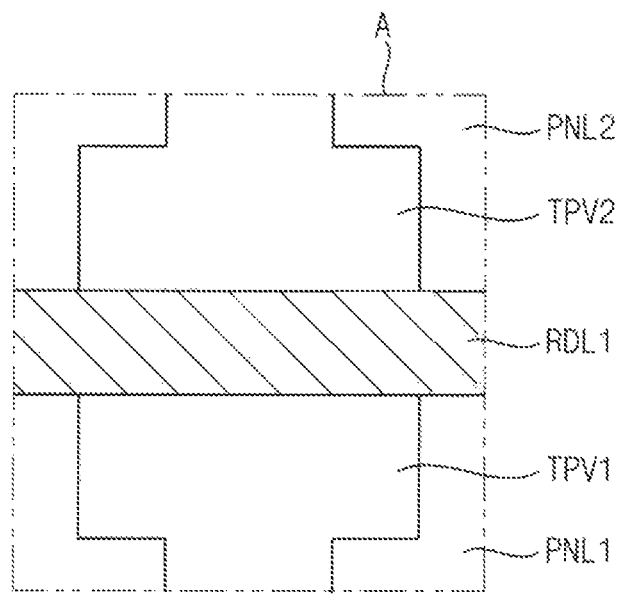
FIGS. 5A to 5E are enlarged cross-sectional views illustrating various embodiments of 'A' portion of the semiconductor package 100 of FIG. 1, according to example embodiments.
Figure 5B:
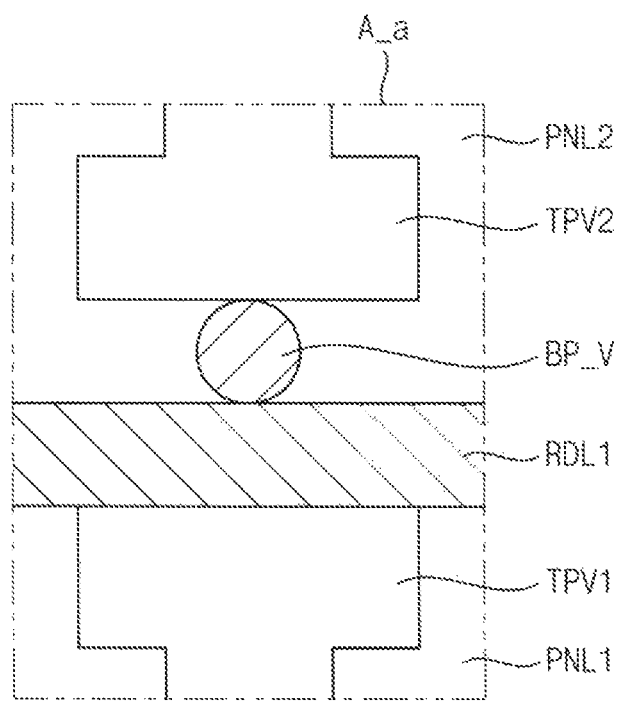

Referring to FIGS. 1 and 5B, a bump BP_V may be placed between the first redistribution layer RDL1 and the second TPV TPV2. In the FIG. 5B, one bump is shown, but the number of bumps is not limited thereto. For example, the bump BP_V may include Cu, Au, Ni, Al, Ag, or an alloy comprising at least one of these metals. Accordingly, the first redistribution layer RDL1 and the second TPV TPV2 may be electrically connected to each other through the bump BP_V. A cross-section of the bump BP_V may be, for example, circular but is not limited thereto.

Figure 5C:
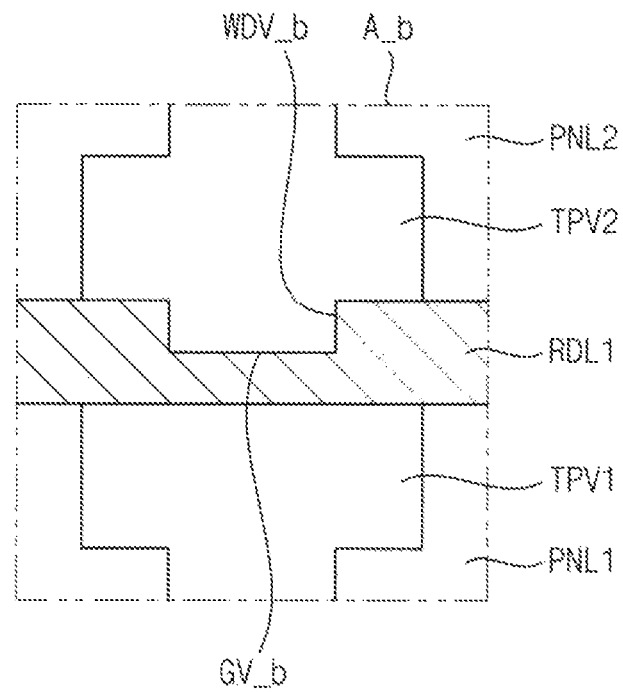
Figure 5D:
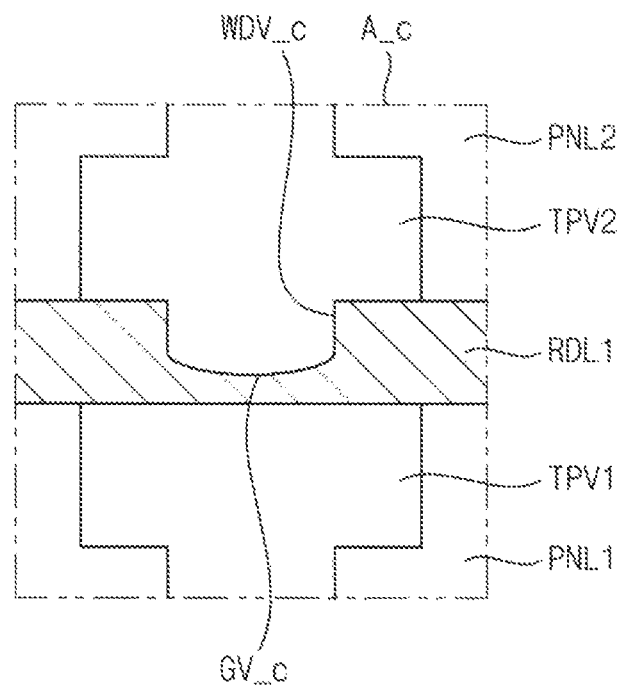
Figure 5E:
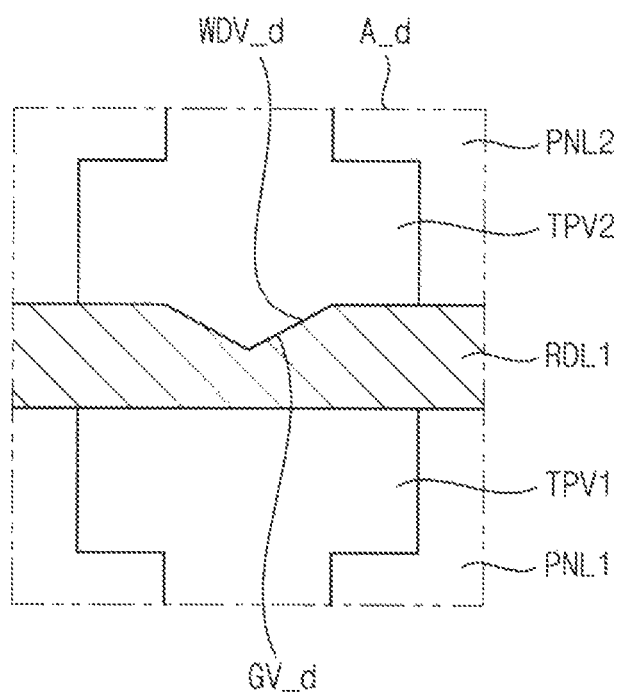

Referring to FIGS. 1 and 5C, the second TPV TPV2 may include a protrusion WDV_b protruding toward the first redistribution layer RDL1. In addition, the first redistribution layer RDL1 may include a groove GV_b combined with the protrusion WDV_b. In some example embodiments, a cross-sectional shape of the protrusion WDV_b and the groove GV_b may be a rectangular shape. In FIGS. 5C to 5E, the protrusions and the grooves engaging with the protrusions are shown one by one, but the number of protrusions and grooves is not limited thereto.

Referring to FIGS. 1 and 5D, the second TPV TPV2 may include a protrusion WDV_c protruding toward the first redistribution layer RDL1. In addition, the first redistribution layer RDL1 may include a groove GV_c combined with the protrusion WDV_c. In some example embodiments, a lower surface of the protrusion WDV_c may have a convex profile toward the first redistribution layer RDL1. In other words, the first redistribution layer RDL1 may include the groove GV_c having a lower surface with a concave profile towards the second TPV TPV2 to engage with the protrusion WDV_c with the convex profile.

Referring to FIGS. 1 and 5E, the second TPV TPV2 may include a protrusion WDV_d protruding toward the first redistribution layer RDL1 In addition, the first redistribution layer RDL1 may include a groove GV_d combined with the protrusion WDV_d. In some example embodiments, a cross-sectional shape of the protrusion WDV_d and the groove GV_d may be triangular.

As described in FIGS. 5A to 5E, elements of the first layer L1 and elements of the second layer L2 are stacked to form the semiconductor package 100. Although only a stacking relationship of the first and second TPVs TPV1 and TPV2 and the first redistribution layer RDL1 is described, respective structures may be stacked in a similar manner between the second TPV TPV2, the third TPV TPV3, the second redistribution layer RDL2 and the third redistribution layer RDL3.

Figure 6:
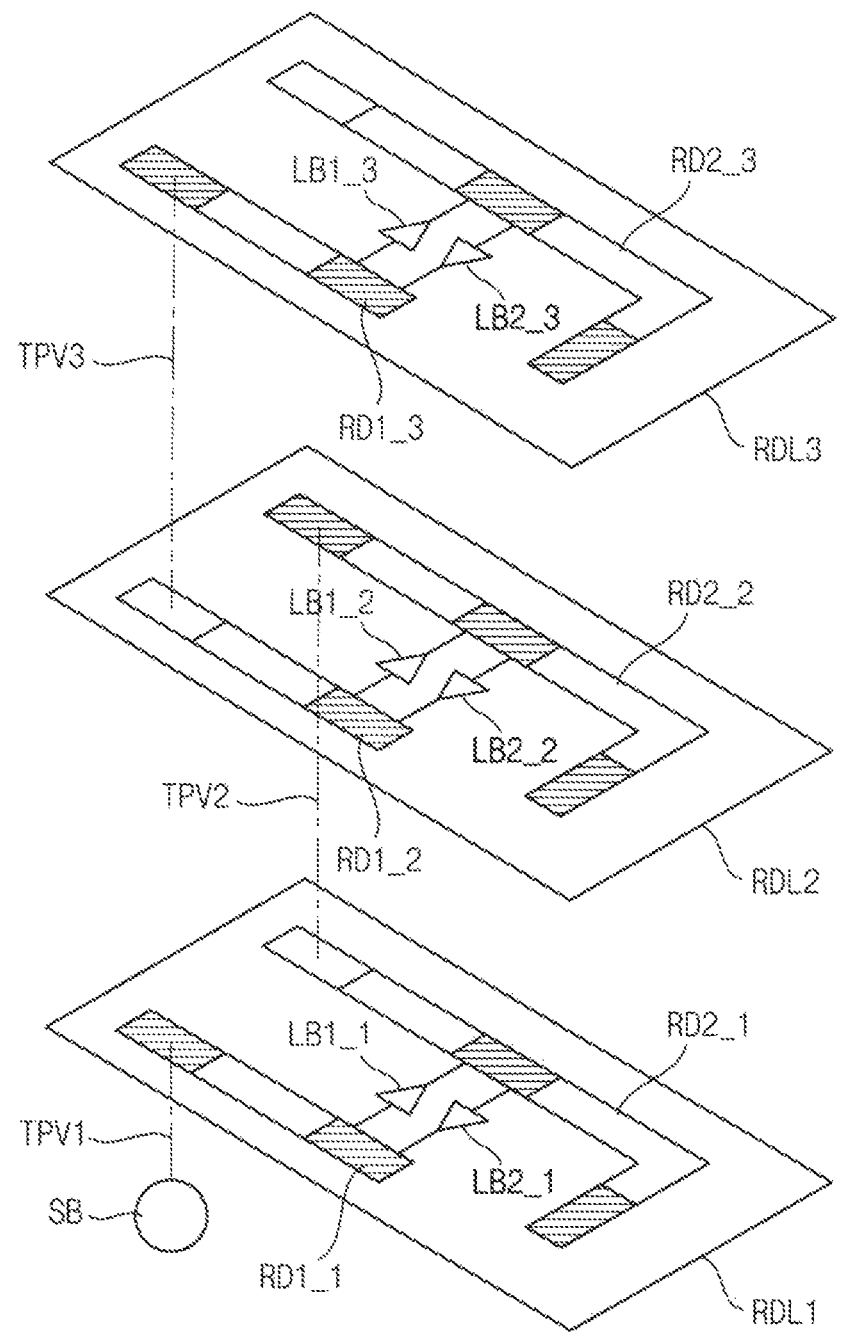
Figure 6:
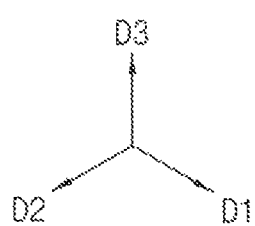
Figure 7:
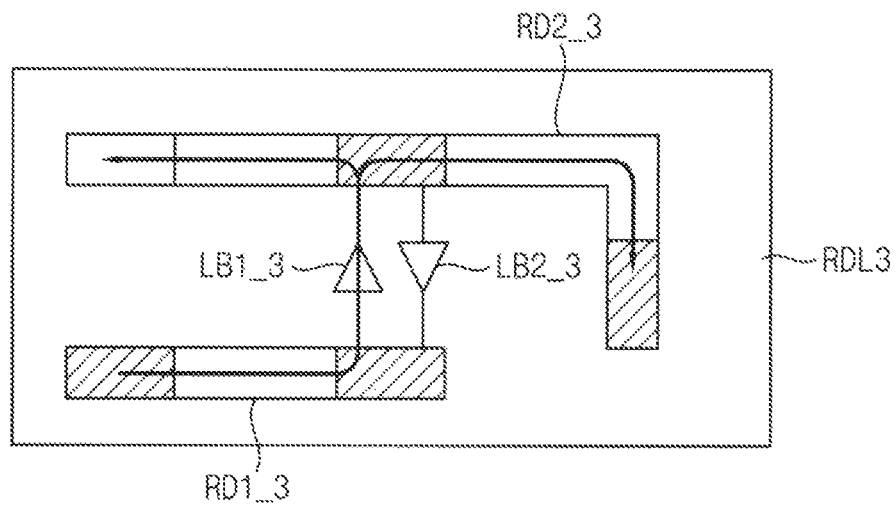
Figure 7:
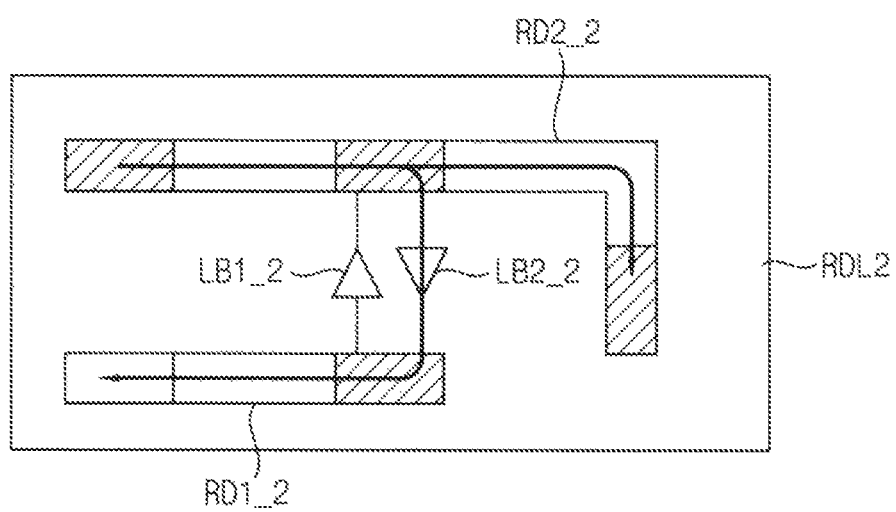
Figure 7:
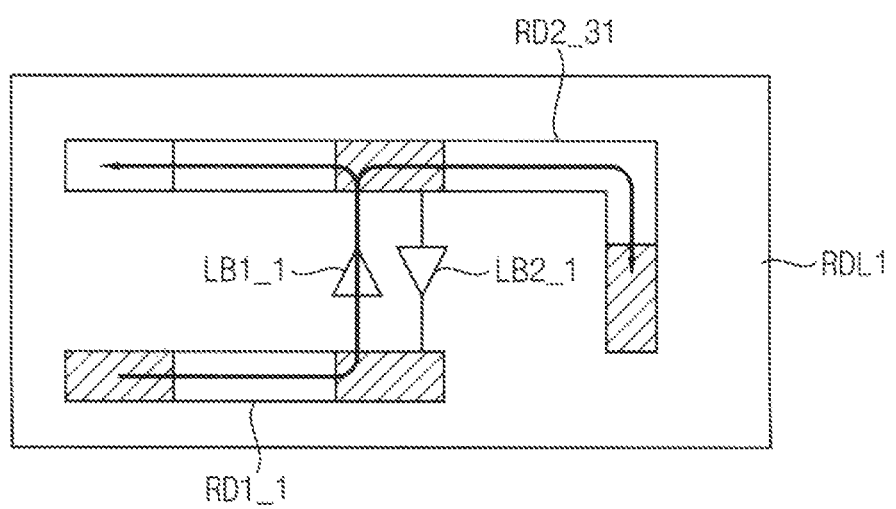

FIG. 6 illustrates a connection relationship between a first redistribution layer RDL 1, a second redistribution layer RDL 2, and a third redistribution layer RDL 3 of a semiconductor package according to example embodiments. FIG. 7 is a plan view illustrating the first redistribution layer RDL1, the second redistribution layer RDL2, and the third redistribution layer RDL3 in FIG. 6, respectively.

Referring to FIGS. 1, 6 and 7, the semiconductor package may be substantially same as the semiconductor package of FIGS. 1 to 4, except for a connection relationship of redistribution layers and TPVs. Therefore, repeated descriptions will be omitted.

The external connection terminal SB may be electrically connected to the first TPV TPV1. The first TPV TPV1 may be electrically connected to the first-first wiring RD1_1 of the first redistribution layer RDL1. the first-first wiring RD1_1 may be electrically connected to the first-first buffer LB1_1 of the first semiconductor chip 110. The first-first buffer LB1_1 may be electrically connected to the second-first wiring RD2_1. The second-first wiring RD2_1 may be electrically connected to the third pad 113, which is an input/output pad, of the first semiconductor chip 110.

The second-first wiring RD2_1 may be electrically connected to the second TPV TPV2. The second TPV TPV2 may be electrically connected to the second-second wiring RD2_2 of the second redistribution layer RDL2. The first-second wiring RD1_2 may be electrically connected to the second-second buffer LB2_2 of the second semiconductor chip 120. The second-second wiring RD2_2 may be electrically connected to the third pad, which is an input/output pad, of the second semiconductor chip 120. The second-second buffer LB2_2 may be electrically connected to the first-second wiring RD1_2.

The first-second wiring RD1_2 may be electrically connected to the third TPV TPV3. The third TPV TPV3 may be electrically connected to the first-third wiring RD1_3 of the third redistribution layer RDL3. The first-third wiring RD1_3 may be electrically connected to the first-third buffer LB1_3 of the third semiconductor chip 130. The first-third buffer LB1_3 may be electrically connected to the second-third wiring RD2_3. The second-third wiring RD2_3 may be electrically connected to the third pad, which is an input/output pad, of the third semiconductor chip 130.

FIG. 7 shows flow of signals inputted through the external connection terminals SB in the first to third redistribution layers RDL1, RDL2 and RDL3. A load of the inside and a load of the outside of the semiconductor package are separated by the first-first buffer LB1_1 of the first semiconductor chip 110, a load of the first layer and a load of the second and higher layers are separated by the second-second buffer LB2_2, and a load of the second layer and a load of the third and higher layers are separated by the first-third buffer LB1_3, so that an entire load of the semiconductor package may be distributed or reduced as compared with the case when no buffer exists between the external connection terminal SB and the input/output pads of the first to third semiconductor chips 110, 120, and 130.

In the present embodiment, since each of the buffers in each layer operates, the maximum load can be 1 (max 1 load), even though the N layers are stacked.

The first-first buffer LB1_1 may be a bidirectional buffer, so that in the case of read/write, the semiconductor package may operate similarly.

Figure 8:
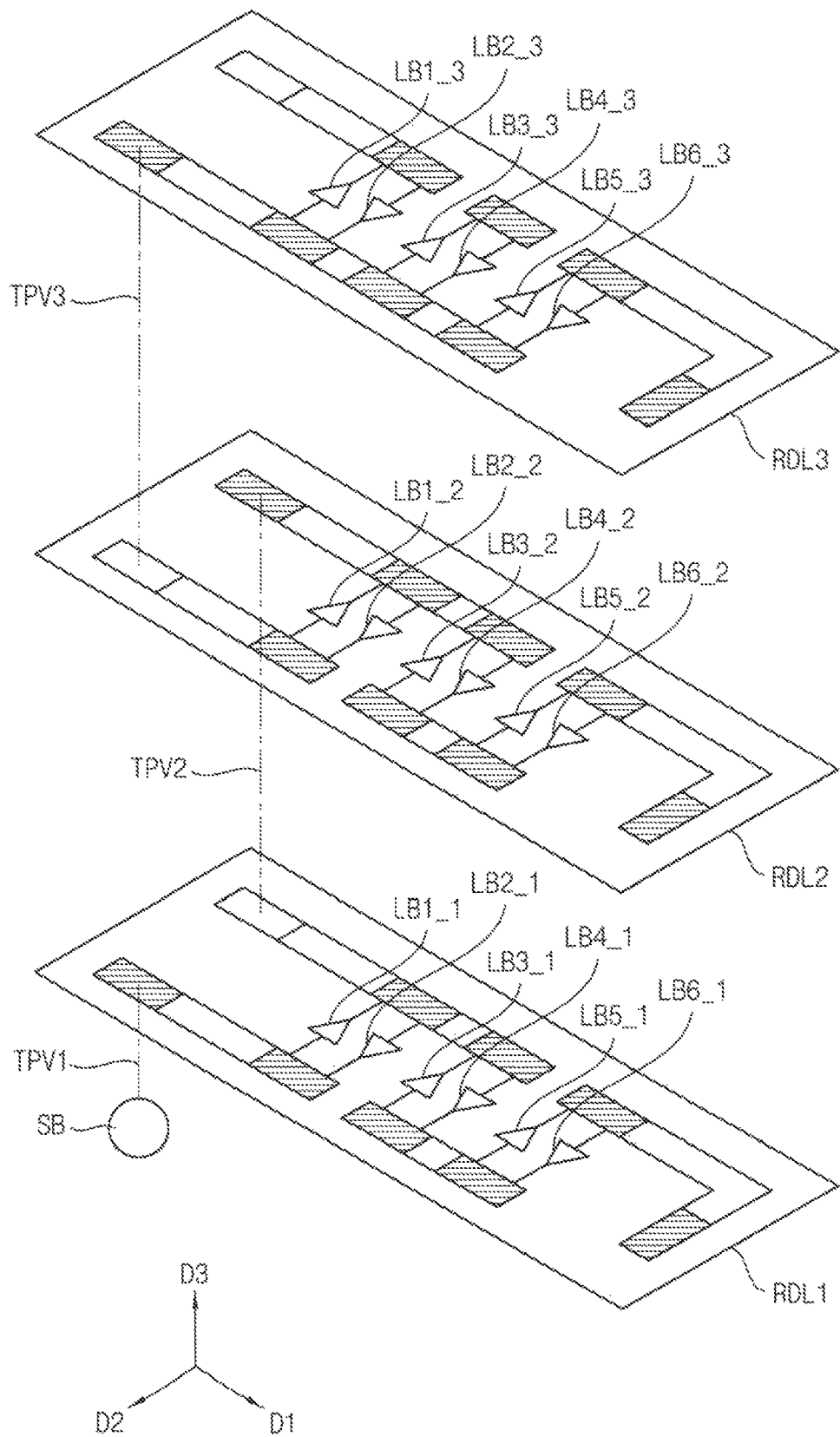
Figure 9:
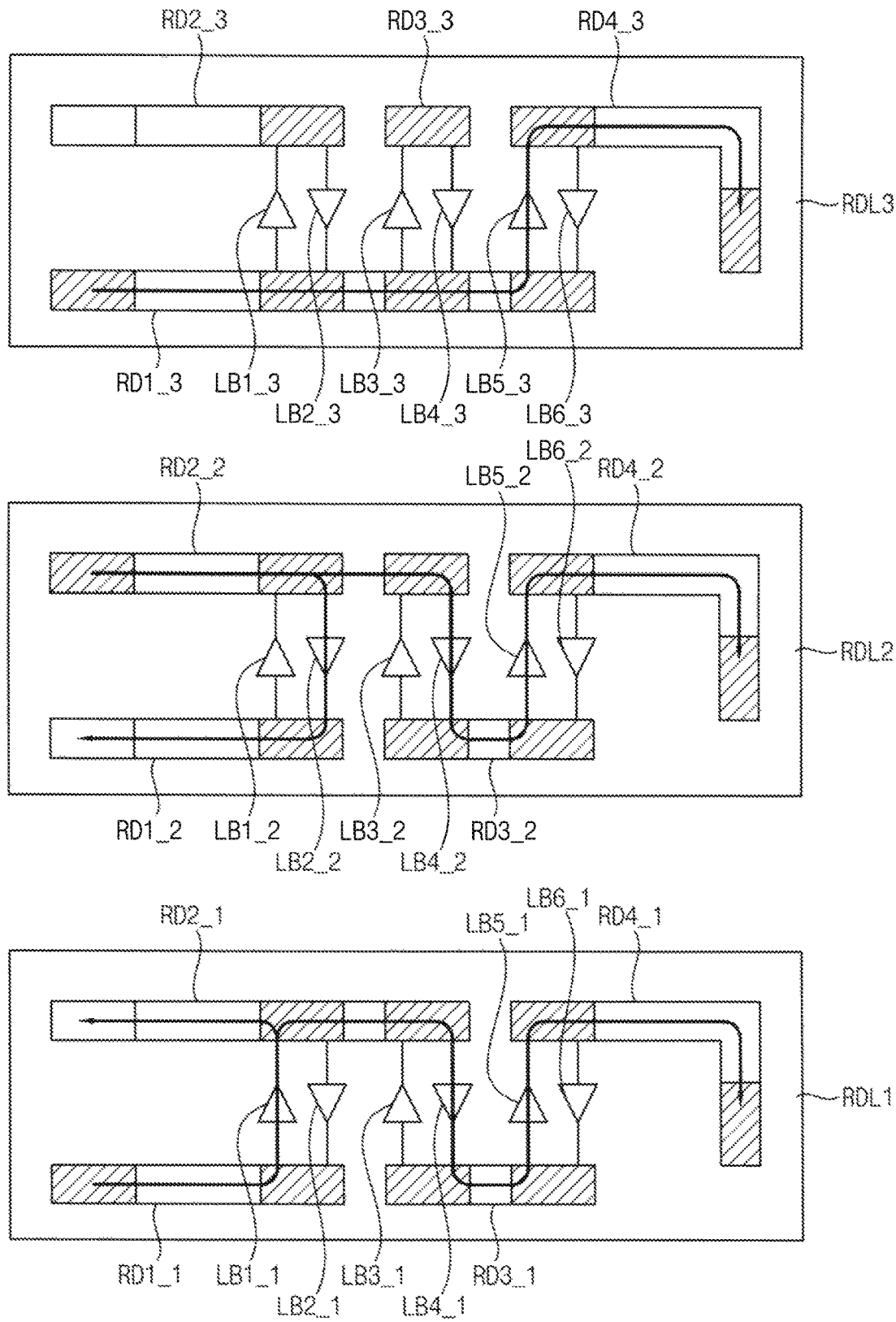

FIG. 8 illustrates a connection relationship between a first redistribution layer RDL1, a second redistribution layer RDL2, and a third redistribution layer RDL3 of a semiconductor package according to example embodiments. FIG. 9 is a plan view illustrating the first redistribution layer RDL1, the second redistribution layer RDL2, and the third redistribution layer RDL3 in FIG. 8, respectively.

Referring to FIGS. 1, 8 and 9, the semiconductor package may be substantially same as the semiconductor package of FIGS. 1 to 4, except a connection relationship of redistribution layers and TPVs and the number of buffers of each semiconductor chip. Therefore, repeated descriptions will be omitted.

Each of the first to third semiconductor chips 110, 120, and 130 may include first to sixth buffers. The first to fourth redistribution layers RDL1, RDL2, and RDL3 may include first to fourth wirings, respectively. In addition, each of the first to third semiconductor chips 110, 120, and 130 may further include pads for connecting the first to sixth buffers to the wirings of the redistribution layer.

The external connection terminal SB may be electrically connected to the first TPV TPV1. The first TPV TPV1 may be electrically connected to the first-first wiring RD1_1 of the first redistribution layer RDL1. The first-first wiring RD1_1 may be electrically connected to the first-first buffer LB1_1 of the first semiconductor chip 110. The first-first buffer LB1_1 may be electrically connected to the second-first wiring RD2_1. The second-first wiring RD2_1 may be electrically connected to the third-first buffer LB3_1. The third-first buffer LB3_1 may be electrically connected to the third-first wiring RD3_1. The third-first wiring RD3_1 may be electrically connected to the fifth-first buffer LB5_1. The fifth-first buffer LB5_1 may be electrically connected to the fourth-first wiring LB4_1. The fourth-first wiring LB4_1 may be electrically connected to the third pad 113, which is an input/output pad of the first semiconductor chip 110.

The second-first wiring RD2_1 may be electrically connected to the second TPV TPV2. The second TPV TPV2 may be electrically connected to the second-second wiring RD2_2 of the second redistribution layer RDL2. The first-second wiring RD1_2 may be electrically connected to the second-second buffer LB2_2 and the fourth-second buffer LB4_2 of the second semiconductor chip 120. The second-second buffer LB2_2 may be electrically connected to the second-first wiring RD2_1. The fourth-second buffer LB4_2 may be electrically connected to the third-second wiring RD3_2. The third-second wiring RD3_2 may be electrically connected to the fifth-second buffer LB5_2. The fifth-second buffer LB5_2 may be electrically connected to the fourth-second wiring RD4_2. The fourth-second wiring RD4_2 may be electrically connected to the third pad, which is an input/output pad, of the second semiconductor chip 120.

The first-second wire RD1_2 may be electrically connected to the third TPV TPV3. The third TPV TPV3 may be electrically connected to the first-third wiring RD1_3 of the third redistribution layer RDL3. The first-third wiring RD1_3 may be electrically connected to the first-third buffer LB1_3 and the fifth-third buffer LB5_3 of the third semiconductor chip 130. The first-third buffer LB1_3 may be electrically connected to the second-third wiring RD2_3. The fifth-third buffer LB5_3 may be electrically connected to the fourth-third wiring RD4_3. The fourth-third wiring RD4_3 may be electrically connected to the third pad, which is an input/output pad, of the third semiconductor chip 130.

FIG. 9 shows flow of signals input through the external connection terminals SB in the first to third redistribution layers RDL1, RDL2 and RDL3. A load of the inside and a load of outside of the semiconductor package are separated by the first-first buffer LB1_1 of the first semiconductor chip 110, a load of the first layer and a load of the second and higher layers are separated by the second-second buffer LB2_2, and a load of the second layer and a load of the third and higher layers are separated by the first-third buffer LB1_3, so that an entire load of the semiconductor package may be distributed or reduced as compared with the case when no buffer exists between the external connection terminal SB and the input/output pads of the first to third semiconductor chips 110, 120, and 130.

In addition, since the number of buffers in each redistribution layer is the same or the number of buffers passing through to the input/output pads of each of the first to third semiconductor chips 110, 120, and 130 is equal to three, a delay problem due to difference in the number of buffers can be solved. In this embodiment, a three layers stacked structure including three buffers for each layer is exemplified. However, the semiconductor chip and the redistribution layer can be designed so as to include N buffers for each layer, so that same effect can be obtained.

Figure 10:
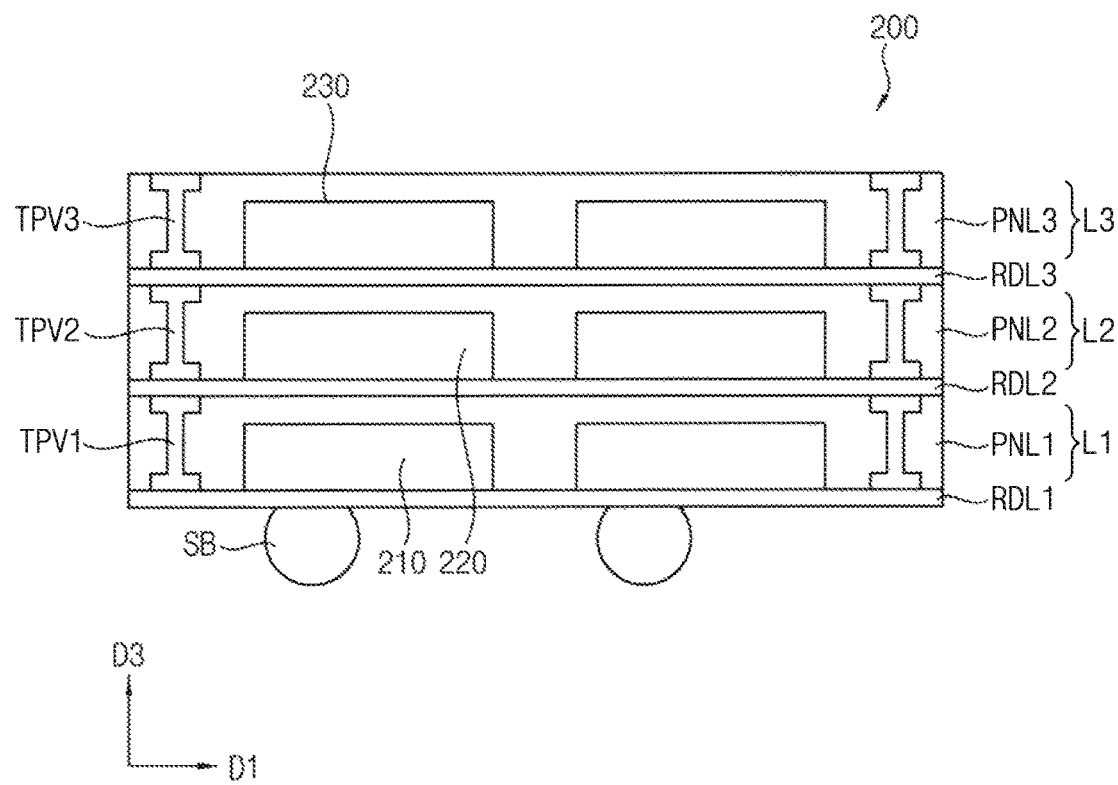
Figure 11A:
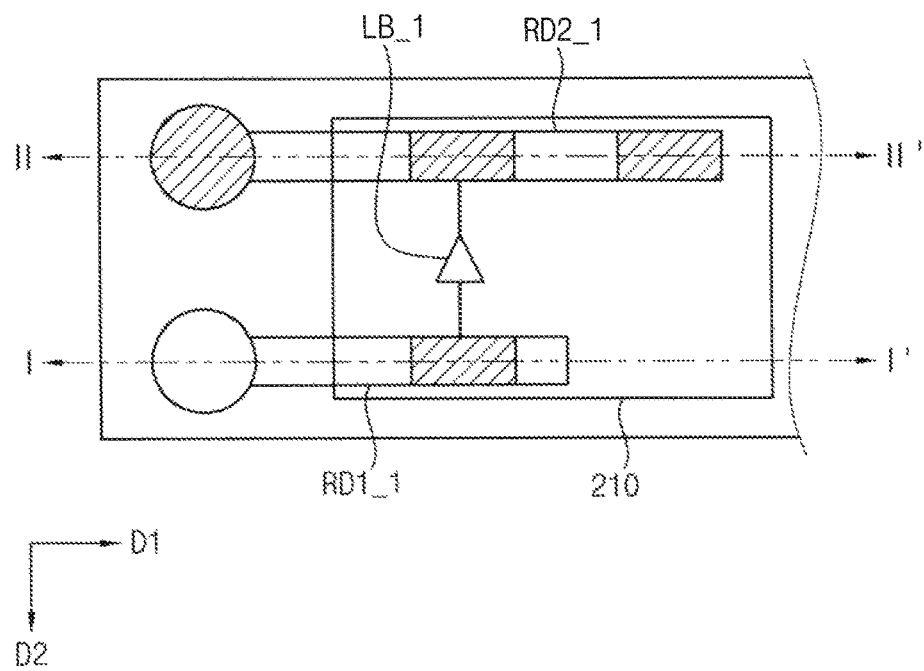
FIGS. 11A, 11B and 11C are respectively a plan view and cross-sectional views of a portion of a first layer L1 of the semiconductor package 200 of FIG. 10 including a first semiconductor chip 210, according to example embodiments.
Figure 11B:
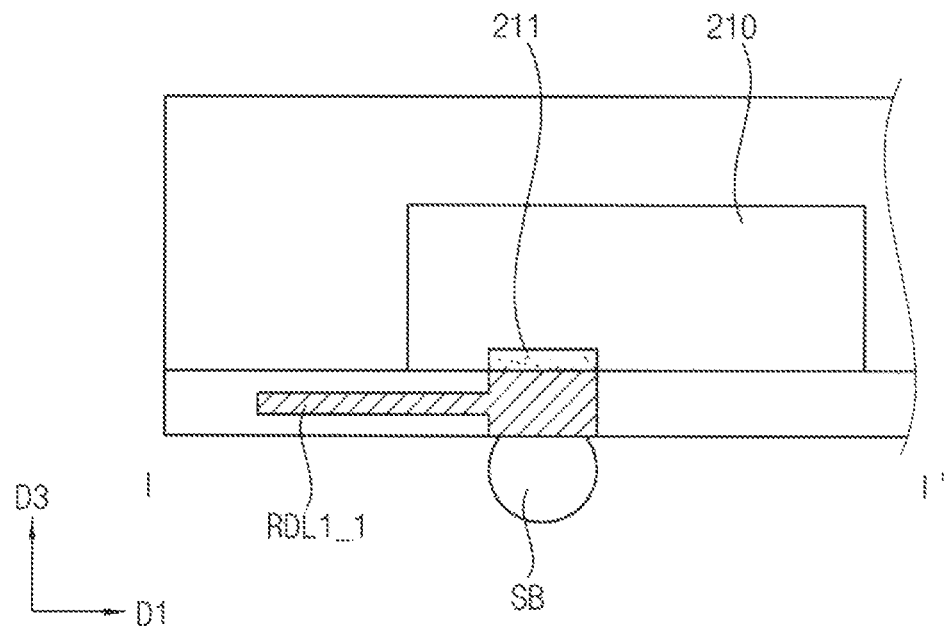
Figure 11C:
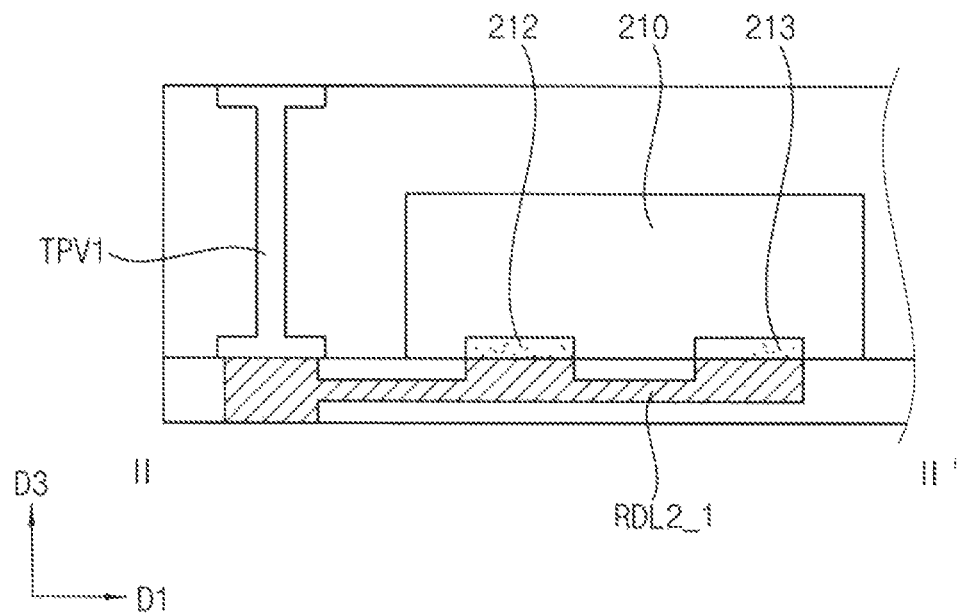
Figure 12:
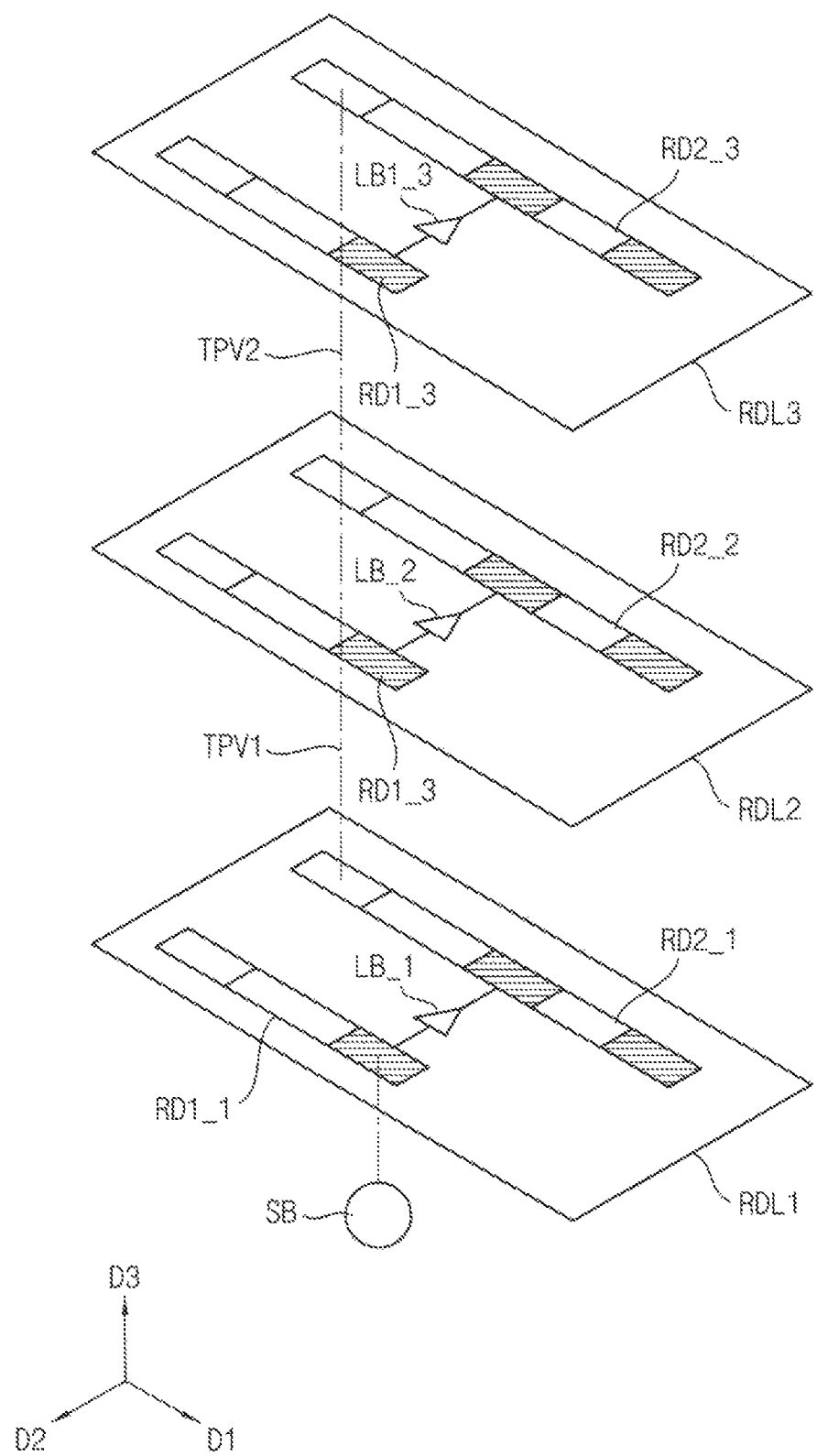
Figure 13:
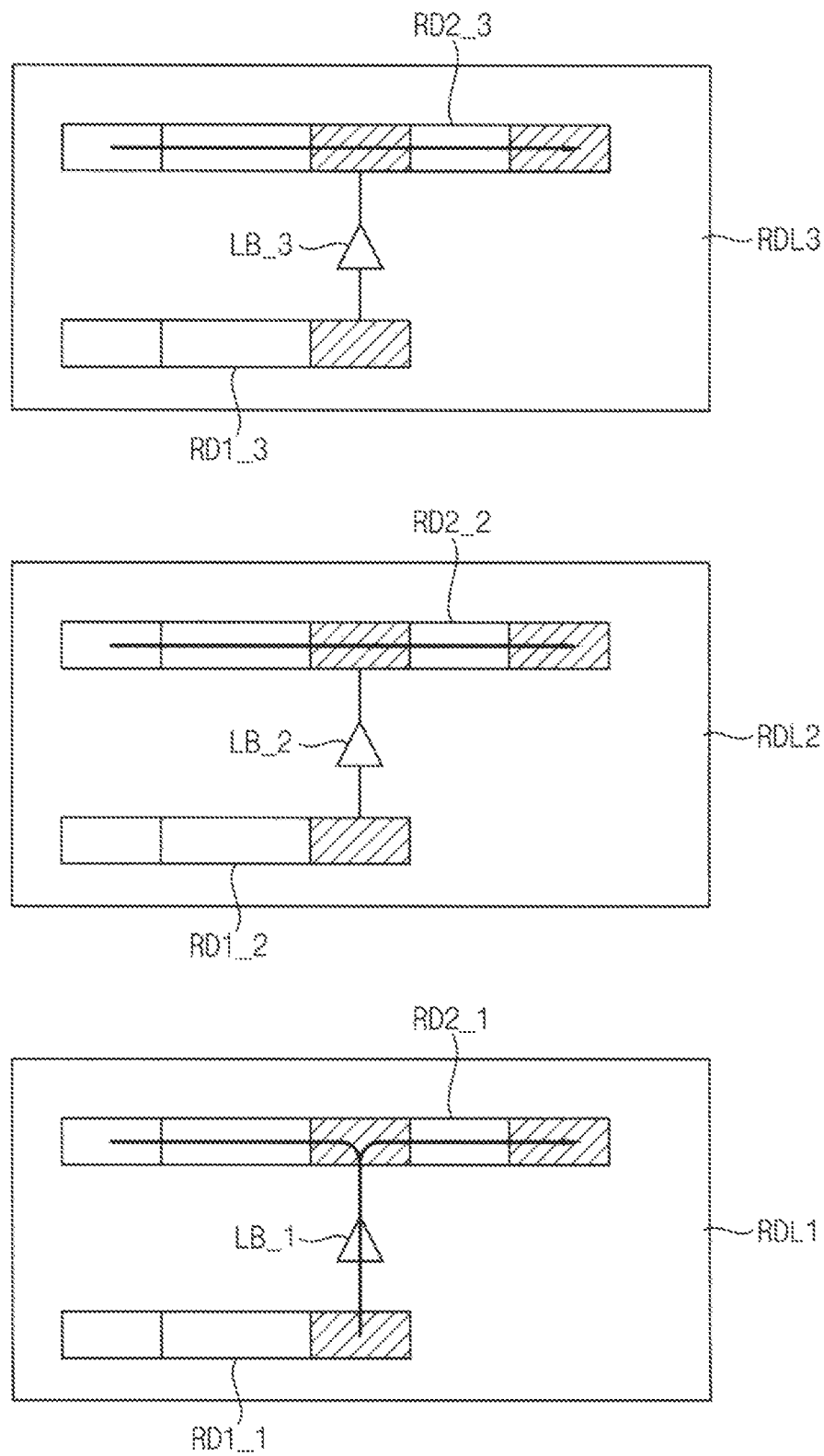

FIG. 10 is a cross-sectional view illustrating a semiconductor package 200 according to example embodiments. FIGS. 11A, 11B and 11C are respectively a plan view and cross-sectional views of a portion of a first layer L1 of the semiconductor package 200 of FIG. 10 including a first semiconductor chip 210, according to exemplary embodiments. FIG. 12 illustrates a connection relationship between a first redistribution layer RDL1, a second redistribution layer RDL2, and a third redistribution layer RDL3 of the semiconductor package 200 of FIG. 10, according to an exemplary embodiment. FIG. 13 is a plan view illustrating the first redistribution layer RDL1, the second redistribution layer RDL2, and the third redistribution layer RDL3 in FIG. 12, respectively, according to an exemplary embodiment.

Referring to FIGS. 10 to 13, the semiconductor package 200 is substantially the same as the semiconductor package 100 of FIGS. 1 to 4, except that positions of the external connection terminals SB and first to third layers L1, L2 and L3 are turned upside down. Therefore, repeated descriptions will be omitted.

The semiconductor package 200 may include a first redistribution layer RDL1, a first layer L1, a second redistribution layer RDL2, a second layer L2, a third redistribution layer RDL3, a third layer L3, and an external connection terminal SB.

The first redistribution layer RDL1 may be disposed on the external connection terminals SB. The first layer L1 may be disposed on the first redistribution layer RDL1. The second redistribution layer RDL2 may be disposed on the first layer L1. The second layer L2 may be disposed on the second redistribution layer RDL2. The third redistribution layer RDL3 may be disposed on the second layer L2. The third layer L3 may be disposed on the third redistribution layer RDL3.

A first semiconductor chip 210 may include a buffer LB_1. A second semiconductor chip 220 may include a buffer LB_2. A third semiconductor chip 230 may include a buffer LB_3. That is, each of the semiconductor chips may include one buffer. The buffer may be a bidirectional buffer.

The external connection terminals SB may be electrically connected to a first-first wiring RD1_1 of the first redistribution layer RDL1. The first-first wiring RD1_1 may be electrically connected to the buffer LB_1. The buffer LB_1 may be electrically connected to a second-first wiring RD2_1. The second-first wiring RD2_1 may be electrically connected to a first TPV TPV1 and a third pad 213, which is an input/output pad, of the first semiconductor chip 210.

The first TPV TPV1 may be electrically connected to the second-second wiring RD2_2 of the second redistribution layer RDL2. The second-second wiring RD2_2 may be electrically connected to the second TPV TPV2. The second-second wiring RD2_2 may be electrically connected to a third pad, which is an input/output pad, of the second semiconductor chip 220.

The second TPV TPV2 may be electrically connected to the second-third wiring RD2_3 of the third redistribution layer RDL3. The second-third wiring RD2_3 may be electrically connected to a third pad, which is an input/output pad, of the second semiconductor chip 230.

According to the present embodiment, since the external connection terminals SB are directly connected to the first redistribution layer RDL1, unlike the semiconductor package 100 of FIGS. 1 to 4, the same circuit configuration can be realized with only one buffer. Therefore, the structure of the semiconductor package 200 is simplified, and the manufacturing process can be simplified.

Figure 14:
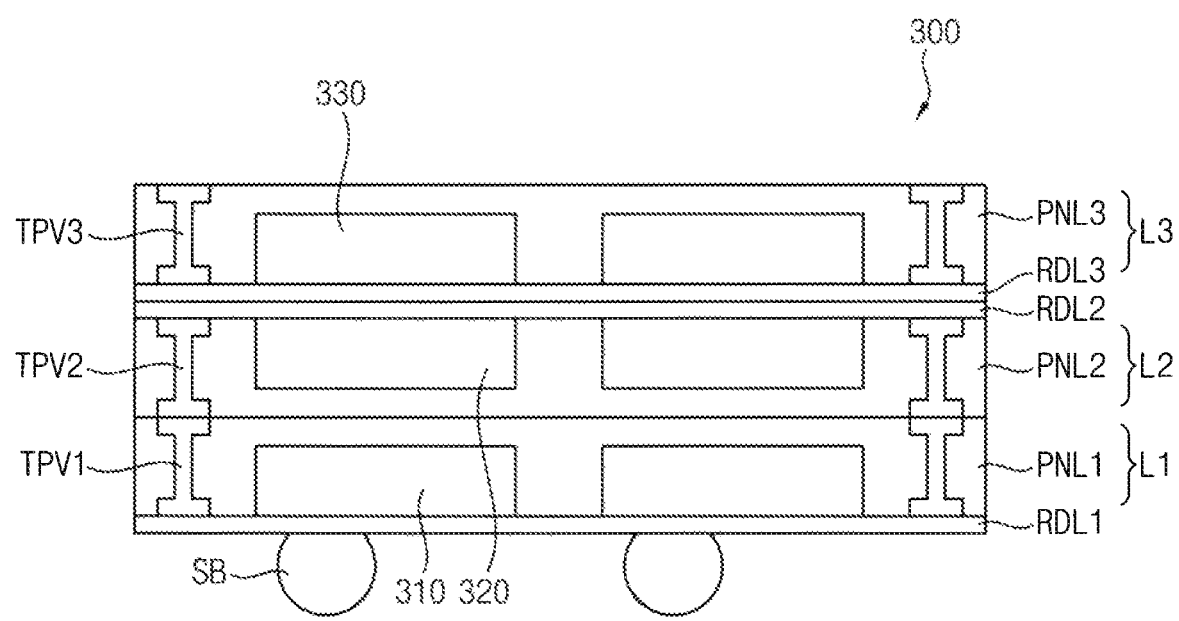
Figure 15:
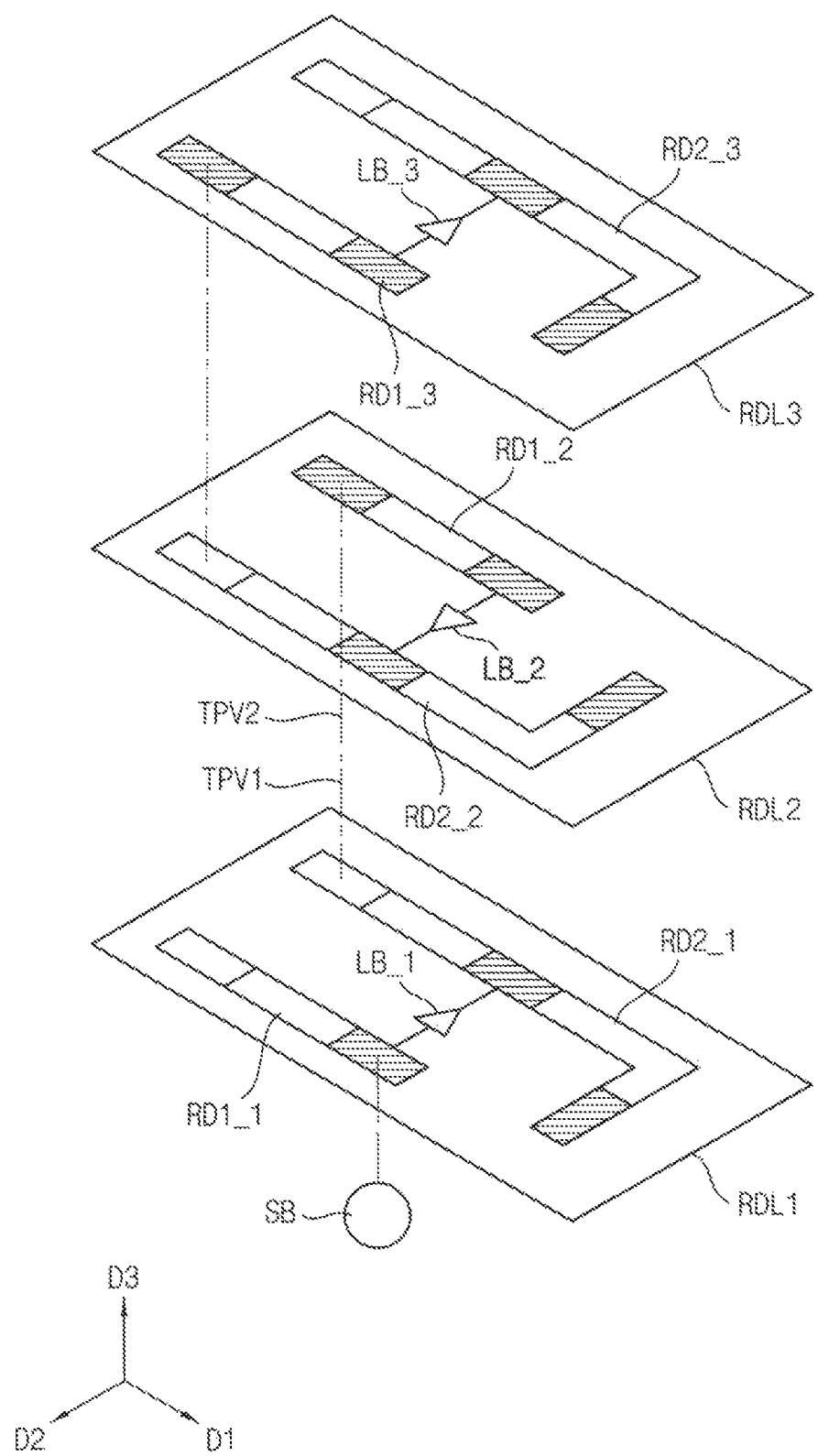
Figure 16:
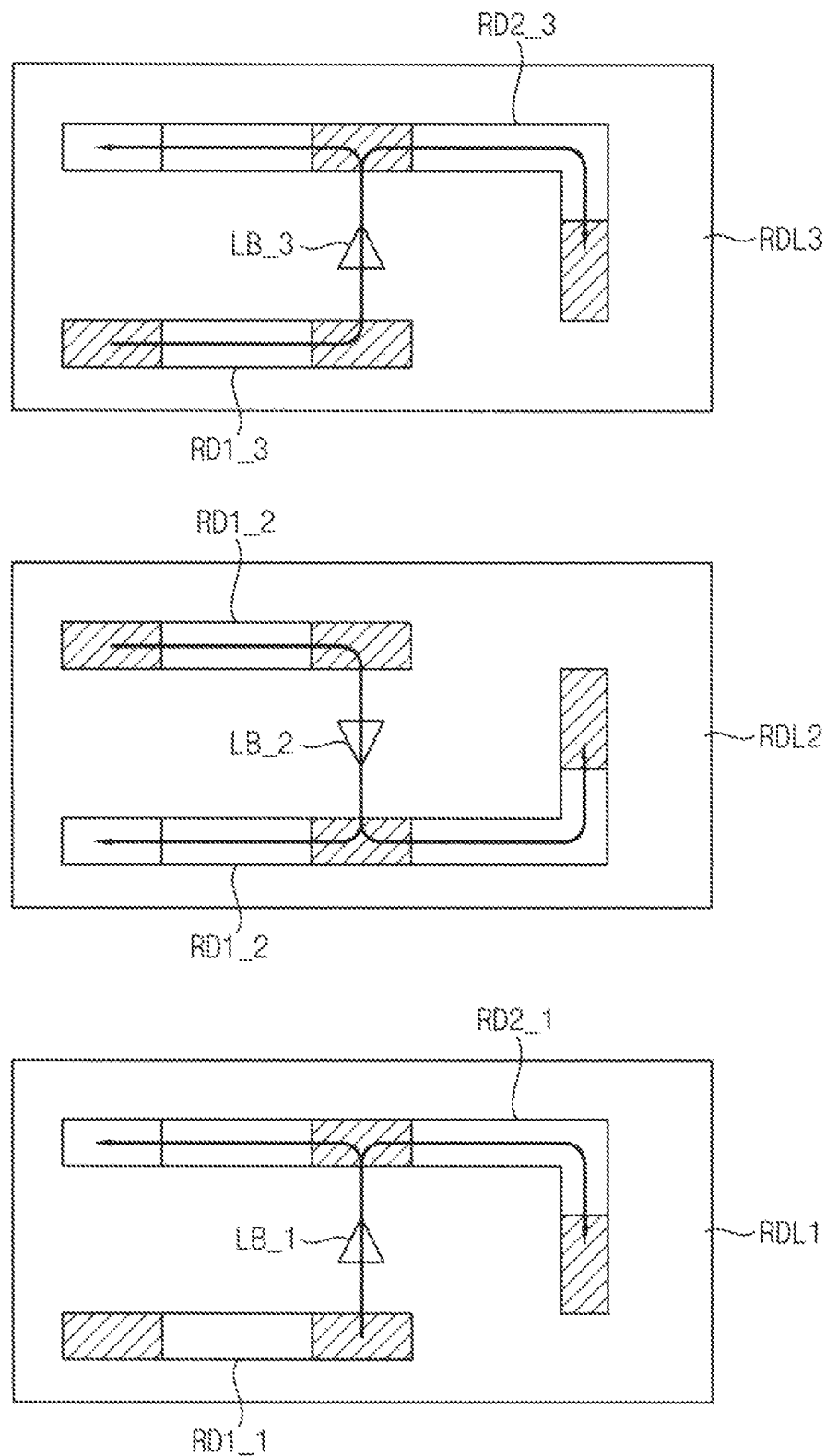
FIG. 16 is a plan view illustrating the first redistribution layer RDL1, the second redistribution layer RDL2, and the third redistribution layer RDL3 in FIG. 15, respectively, according to example embodiments.

FIG. 14 is a cross-sectional view illustrating a semiconductor package 300 according to example embodiments. FIG. 15 illustrates a connection relationship between a first redistribution layer RDL1, a second redistribution layer RDL2, and a third redistribution layer RDL3 of the semiconductor package 300 of FIG. 14. FIG. 16 is a plan view illustrating the first redistribution layer RDL1, the second redistribution layer RDL2, and the third redistribution layer RDL3 in FIG. 15, respectively.

Referring to FIGS. 14 to 16, the semiconductor package 300 is substantially same as the semiconductor package 200 of FIGS. 10 to 13, except that first to third layers L1, L2, and L3 are alternately arranged in an inverted manner. Therefore, repeated descriptions will be omitted.

The semiconductor package 300 may include a first redistribution layer RDL1, a first layer L1, a second layer L2, a second redistribution layer RDL2, a third redistribution layer RDL3, a third layer L3, and an external connection terminal SB.

The first redistribution layer RDL1 may be disposed on the external connection terminals SB. The first layer L1 may be disposed on the first redistribution layer RDL1. The second layer L2 may be disposed on the first layer L. The second redistribution layer RDL2 may be disposed on the second layer L2. The third redistribution layer RDL3 may be disposed on the second redistribution layer RDL2. The third layer L3 may be disposed on the third redistribution layer RDL3.

A first semiconductor chip 310 may include a buffer LB_1. A second semiconductor chip 320 may include a buffer LB_2. A third semiconductor chip 330 may include a buffer LB_3. That is, each of the semiconductor chips may include one buffer. The buffer may be a bidirectional buffer.

The external connection terminals SB may be electrically connected to a first wiring RD1_1 of the first redistribution layer RDL1. The first-first wiring RD1_1 may be electrically connected to the buffer LB_1. The buffer LB_1 may be electrically connected to a second-first wiring RD2_1. The second-first wiring RD2_1 may be electrically connected to a first TPV TPV1 and a third pad, which is an input/output pad, of the first semiconductor chip 310.

The first TPV TPV1 may be electrically and physically directly connected to a second TPV TPV2. The second TPV TPV2 may be electrically connected to a second-second wiring RD2_2 of the second redistribution layer RDL2. The second-second wiring RD2_2 may be electrically connected to the buffer LB_2. The buffer LB_2 may be electrically connected to the first-second wiring RD1_2. The second-second wiring RD2_2 may be electrically connected to a first-third wiring RD1_3 of the third redistribution layer RDL3. Here, since the second-second wiring RD2_2 and the first-third wiring RD1_3 face each other, they can be connected to each other without an additional TPV. The second-second wiring RD2_2 may be electrically connected to a third pad, which is an input/output pad, of the second semiconductor chip 320.

The first-third wiring RD1_3 may be electrically connected to the buffer LB_3. The buffer LB_3 may be electrically connected to a second-third wiring RD2_3. The second-third wiring RD2_3 may be electrically connected to a third pad, which is an input/output pad, of the third semiconductor chip 330.

According to the present embodiment, since the first layer, the second layer and the third layer are turned upside down alternately, unlike the semiconductor package 100 of FIGS. 6 and 7, the same circuit configuration can be realized with only one buffer. Therefore, a structure of the semiconductor package 300 is simplified, and a manufacturing process can be simplified. In addition, since positions of the TPVs and the semiconductor chips and the wiring structure of the redistribution layer are identical to each other in the first layer, the second layer and the third layer, they can be manufactured using the same process. Accordingly, the manufacturing cost can be reduced.

Figure 17:
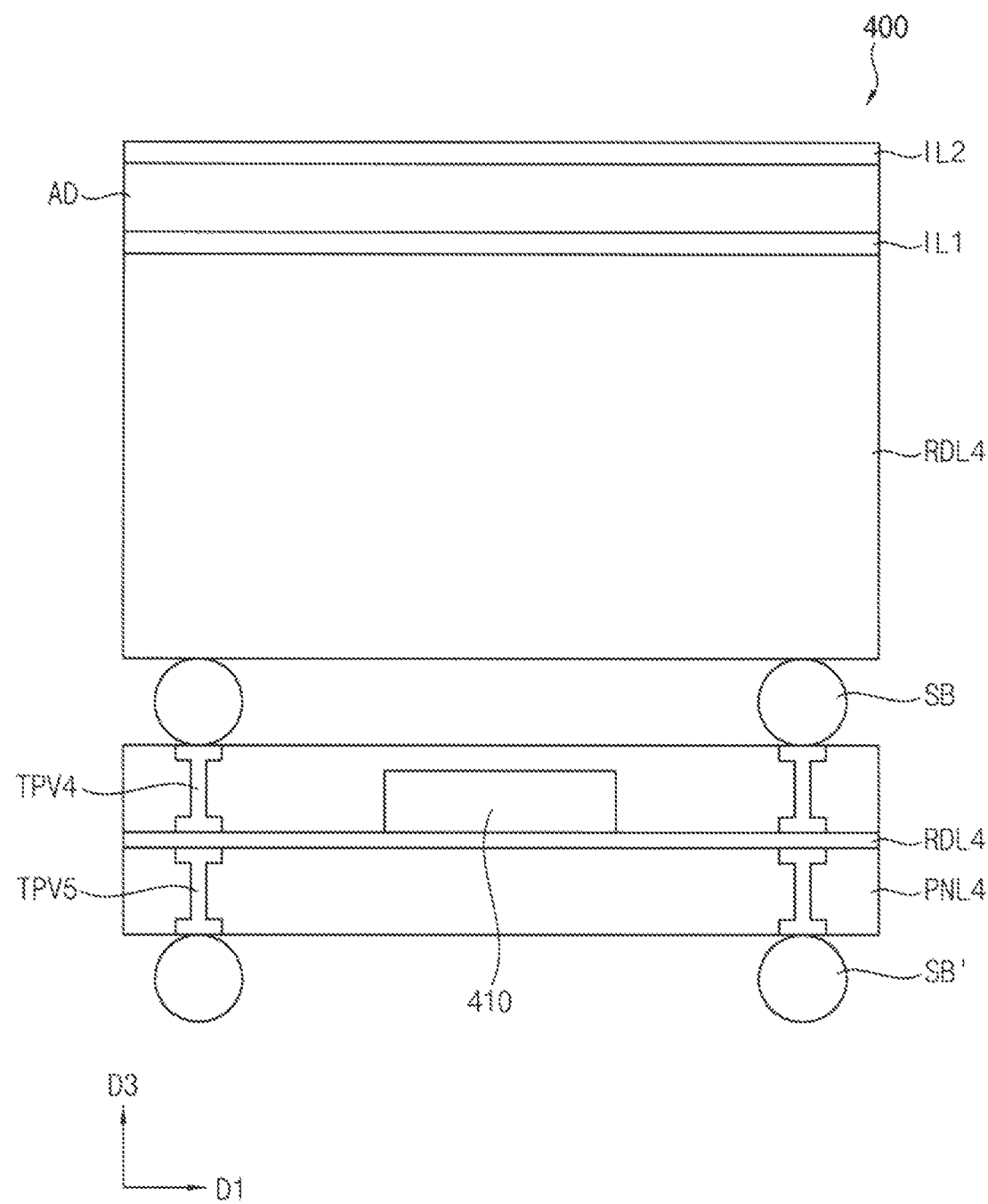
FIG. 17 is a cross-sectional view illustrating a semiconductor package 400 according to example embodiments.

FIG. 17 is a cross-sectional view illustrating a semiconductor package 400 according to example embodiments.

Referring to FIG. 17, the semiconductor package 400 may further include solder balls SB and SB', a fourth panel PNL4 and a fourth redistribution layer RDL4 stacked in a third direction D3 on the fourth panel PNL4, a fourth semiconductor chip 410 electrically connected to the fourth redistribution layer RDL4 through a pad, and a molding layer MD covering the fourth semiconductor chip 410. In addition, the semiconductor package 400 may further include a fourth TPV4 which is electrically connected to the fourth redistribution layer RDL4 and the solder ball SB through the molding layer MD, and a fifth TPV TPV5 which is electrically connected to the fourth redistribution layer RDL4 and the solder ball SB' through the fourth panel PNL4.

The semiconductor package 400 shown in FIG. 17 may be the semiconductor packages described in FIGS. 6 to 16 as well as the semiconductor package 100 described in FIGS. 1 to 4. Detailed descriptions thereof will be omitted.

The molding layer MD may mold the fourth semiconductor chip 410. At least a portion of the fourth TPV TPV4 may be exposed to outside from the molding layer MD. The molding layer MD may include a polymer layer such as a resin. The molding layer MD may include, for example, an epoxy molding compound (EMC).

The fourth semiconductor chip 410 may be a memory chip or a logic chip. For example, when the first to third semiconductor chips (see 110, 120 and 130 in FIG. 1) are memory chips, the fourth semiconductor chip 410 may include a memory controller for controlling the first to third semiconductor chips. The semiconductor package 400 may include, for example, a system on chip (SoC) or a system in package (SIP).

The semiconductor package 400 may further include a first insulating layer IL1, a second insulating layer IL2 and an additional layer AD formed between the first insulating layer IL1 and the second insulating layer IL2. In some example embodiments, the additional layer AD may include a device such as a capacitor or an inductor. Alternatively, the additional layer AD may include additional semiconductor chips, including the same or similar structure as the first to third layers (see L1 to L3 in FIG. 1).

Figure 18:
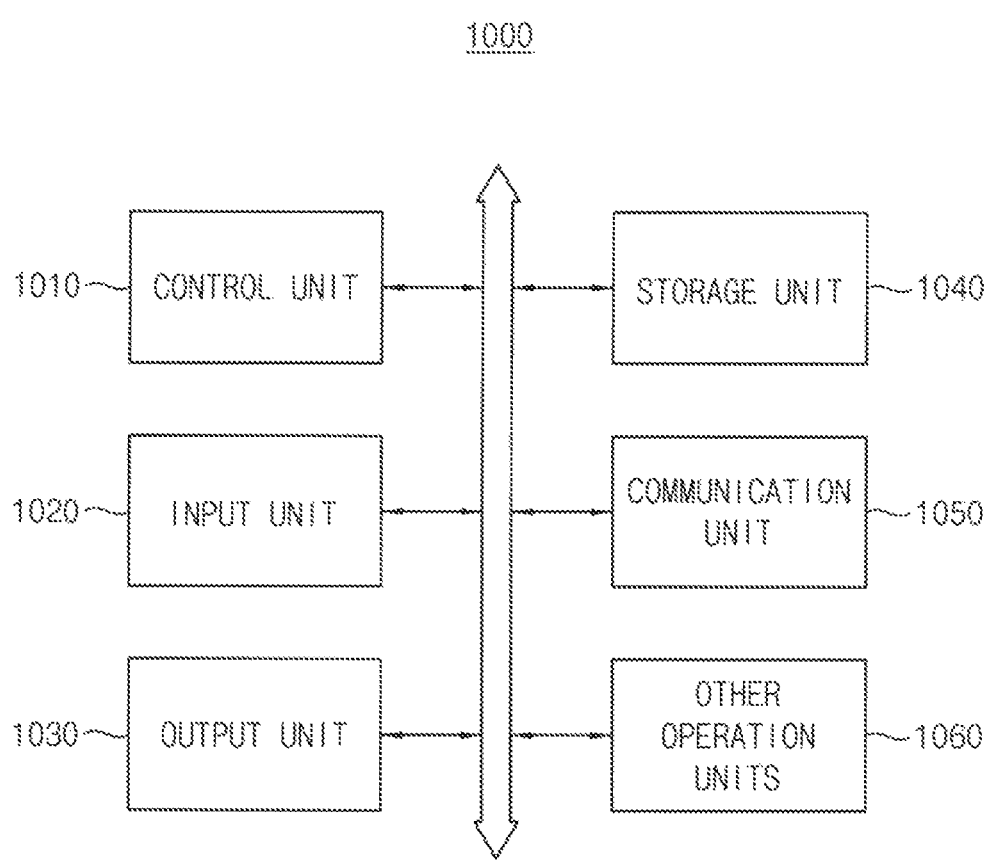
FIG. 18 is a block diagram schematically illustrating an electronic system including a semiconductor package according to example embodiments.

FIG. 18 is a block diagram schematically illustrating an electronic system including a semiconductor package according to example embodiments.

Referring to FIG. 18, an electronic system 1000 may include a control unit 1010, an input unit 1020, an output unit 1030, and a storage unit 1040, and may further include a communication unit 1050 and/or other operation units 1060.

The control unit 1010 may collectively control the electronic system 1000 and each of the components. The control unit 1010 may be a central processing unit (CPU) or a central controlling unit. The input unit 1020 may send electrical command signals to the control unit 1010. The input unit 1020 may include a keyboard, a keypad, a mouse, a touch pad, an image recognizer such as a scanner, or various input sensors. The output unit 1030 may receive electrical signals from the control unit 1010, and output results processed by the electronic system 1000. The output unit 1030 may include a monitor, a printer, a beam projector, or various mechanical devices.

The storage unit 1040 may be a component for temporarily or permanently storing electrical signals which are to be processed or have been processed by the control unit 1010. The storage unit 1040 may be physically or electrically connected or coupled to the control unit 1010. The communication unit 1050 may receive electrical command signals from the control unit 1010, and send electrical signals to or receive electrical signals from other electronic systems. The other operation units 1060 may perform physical or mechanical operations according to commands of the control unit 1010.

In example embodiments, at least one of the control unit 1010, the input unit 1020, the output unit 1030, the storage unit 1040, the communication unit 1050, and the other operation unit 1060 may include the semiconductor package disclosed in FIG. 1 to 13. Accordingly, a volume of the electronic system 1000 can be reduced, and the read/write load can be reduced.

Figure 19:
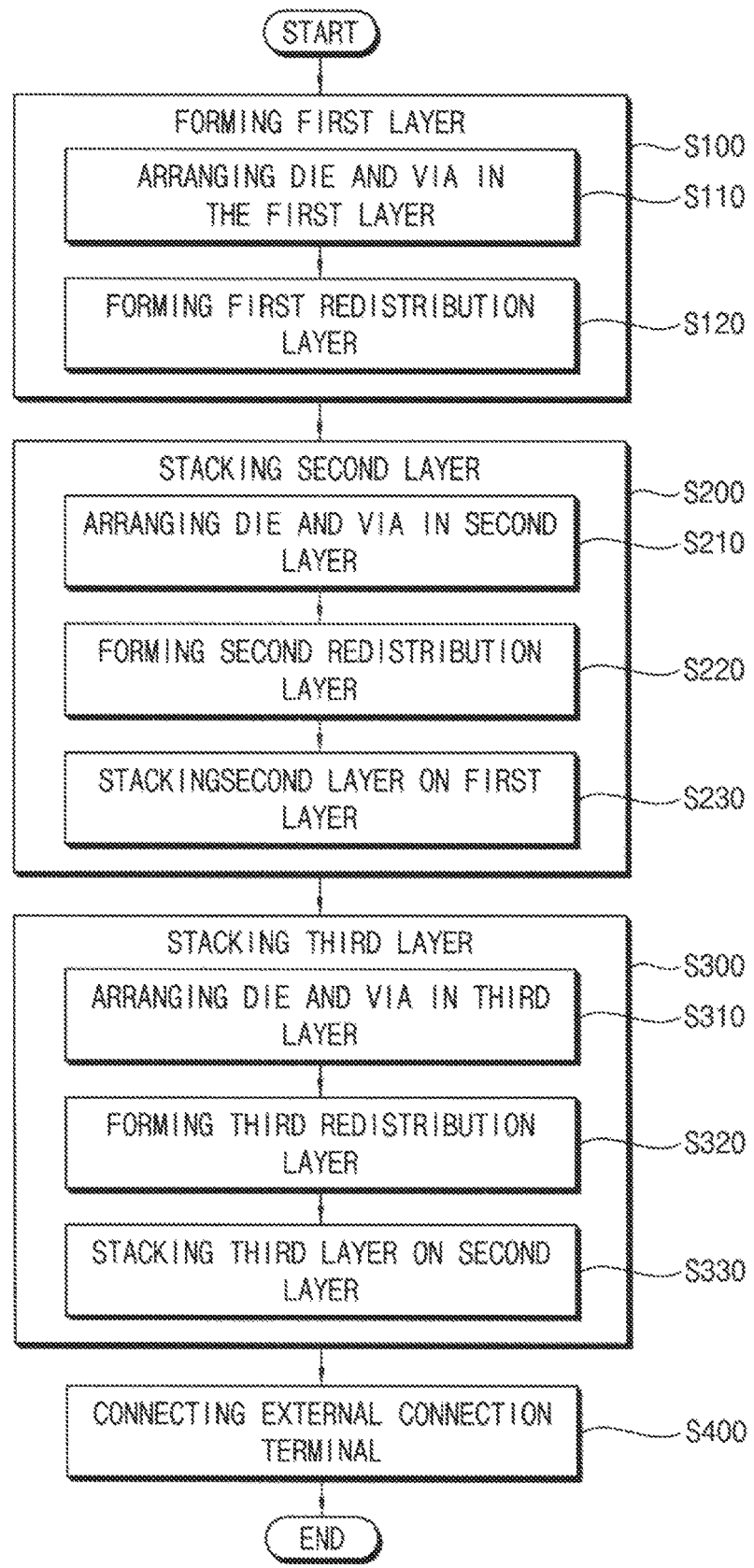
FIG. 19 is a flowchart illustrating a method of manufacturing a semiconductor package according to example embodiments.
Figure 20A:
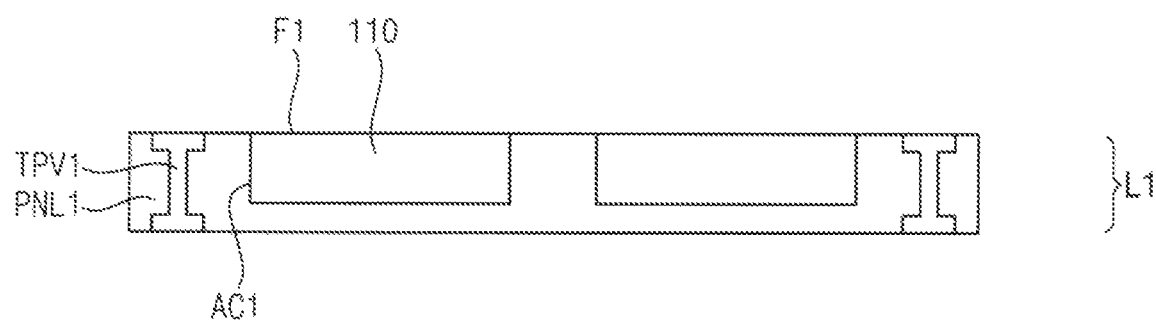
FIGS. 20A, 20B, 20C, and 20D are cross-sectional views illustrating a method of manufacturing the semiconductor package 100 of FIG. 1, according to example embodiments.
Figure 20B:
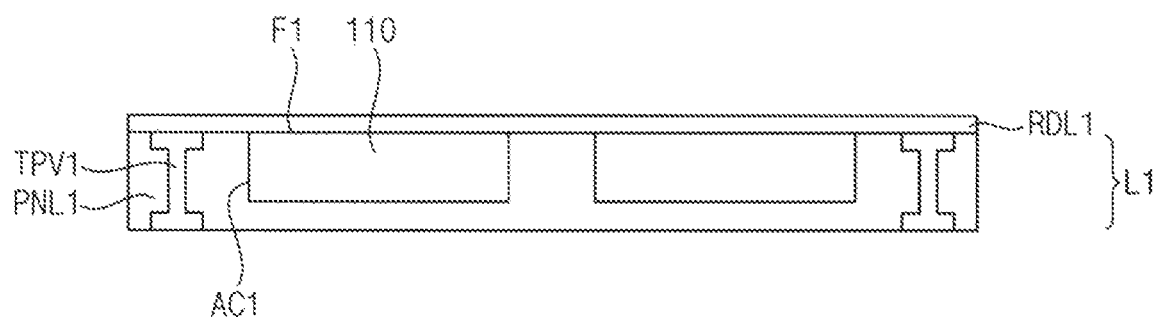
Figure 20C:
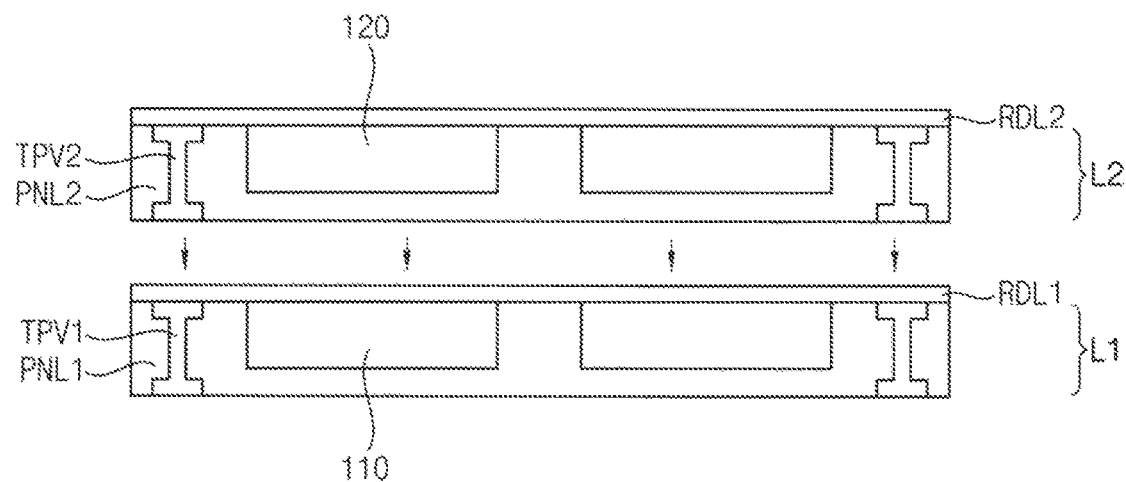
Figure 20D:
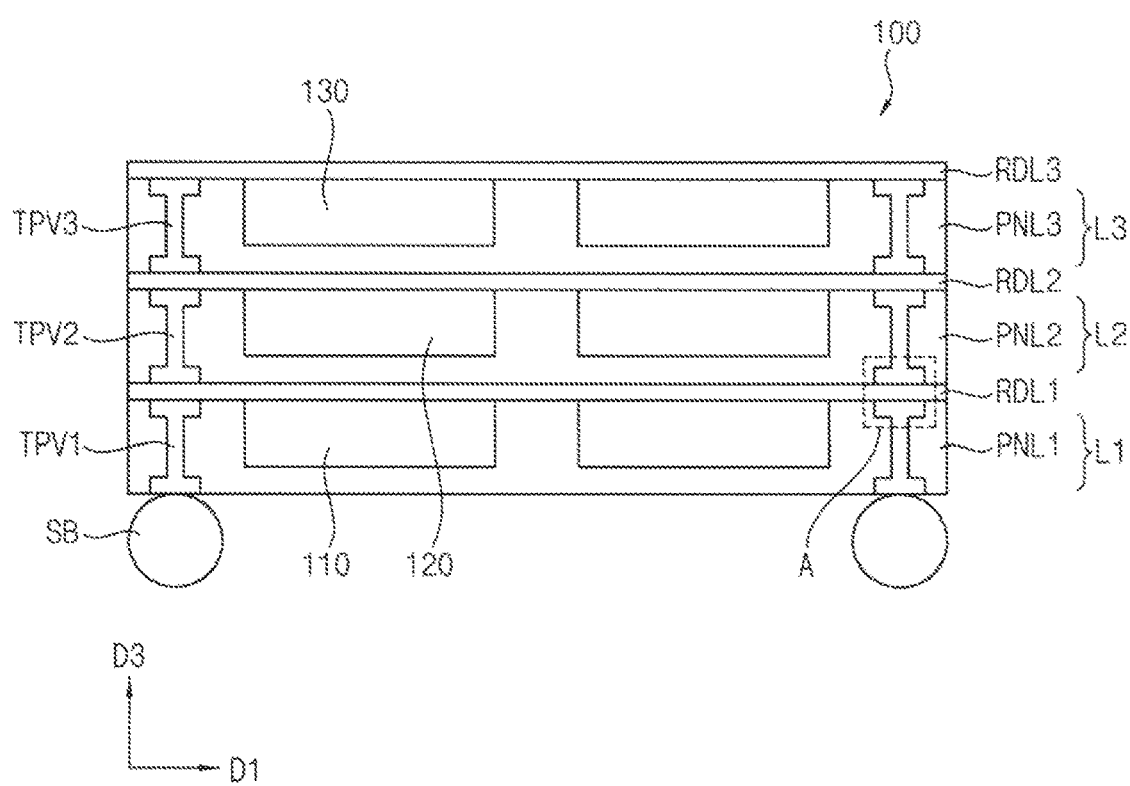
Figure 21A:
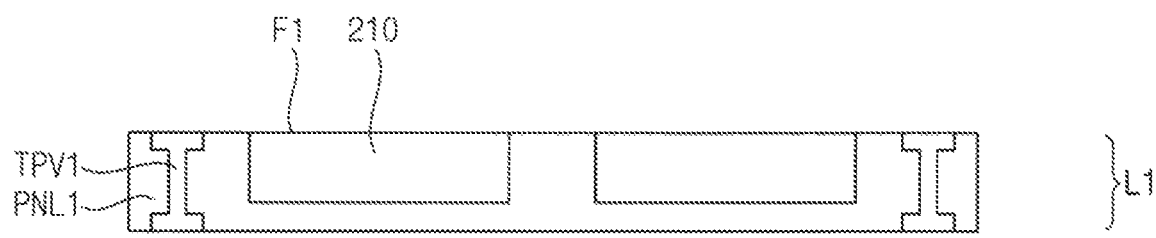
FIGS. 21A, 21B, 21C, and 21D are cross-sectional views illustrating a method of manufacturing the semiconductor package 200 of FIG. 10, according to example embodiments.
Figure 21B:
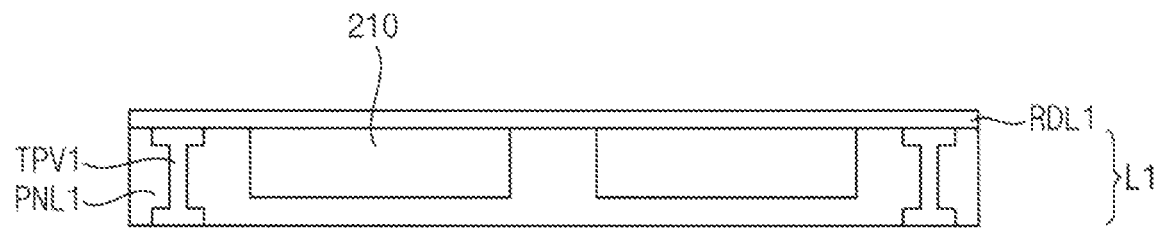
Figure 21C:
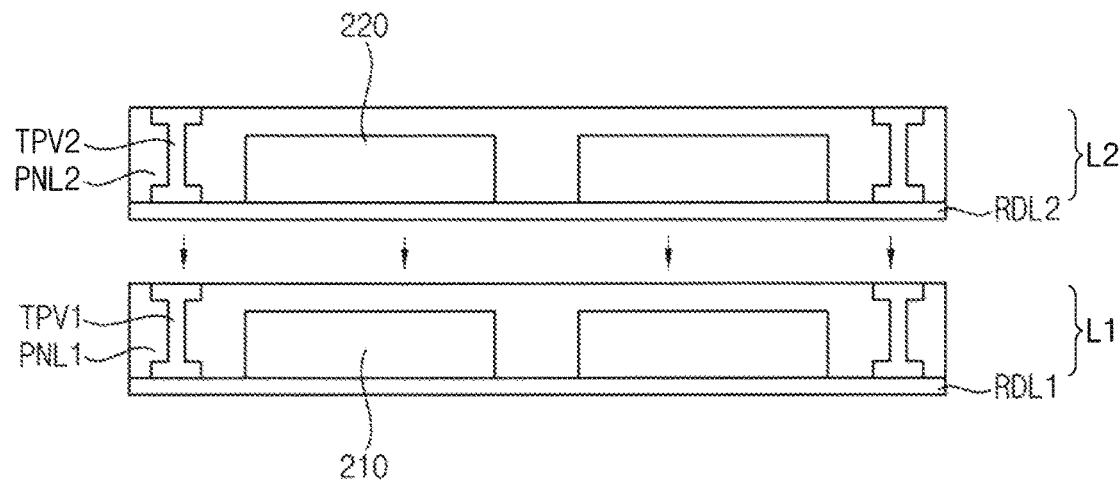
Figure 21D:
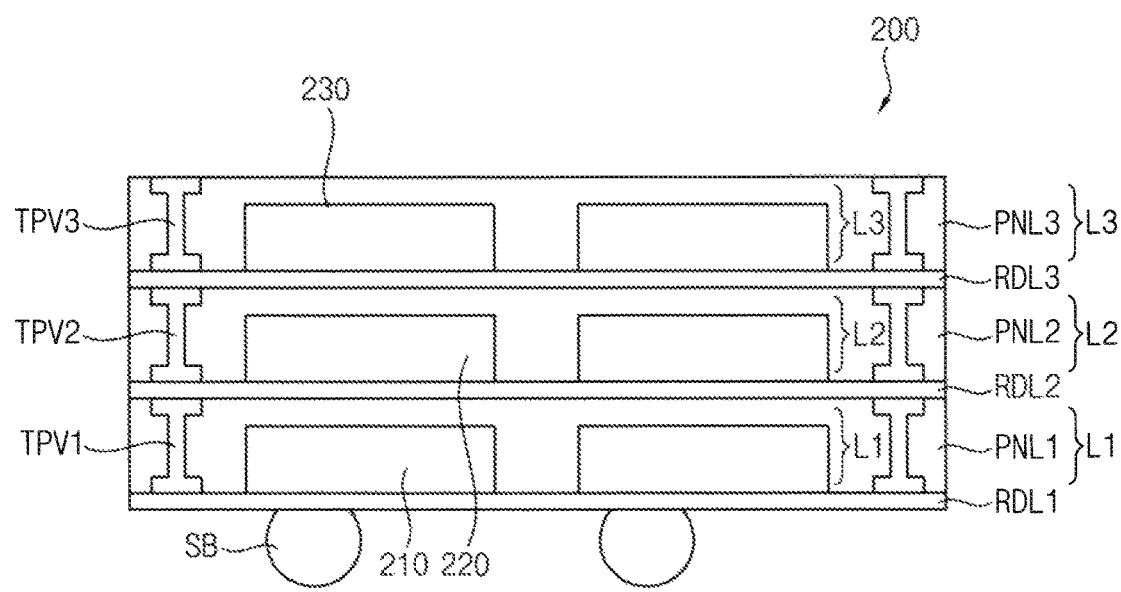
Figure 22A:
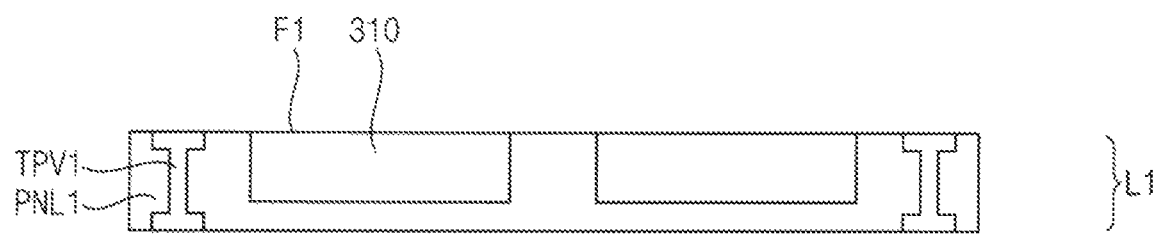
FIGS. 22A, 22B, 22C, and 22D are cross-sectional views illustrating a method of manufacturing the semiconductor package 300 of FIG. 17, according to example embodiments.
Figure 22B:
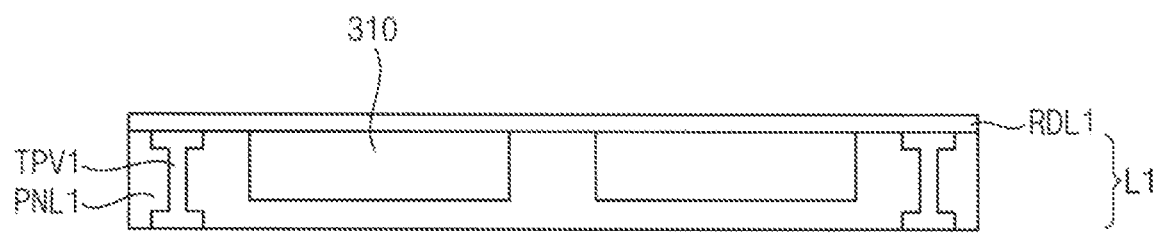
Figure 22C:
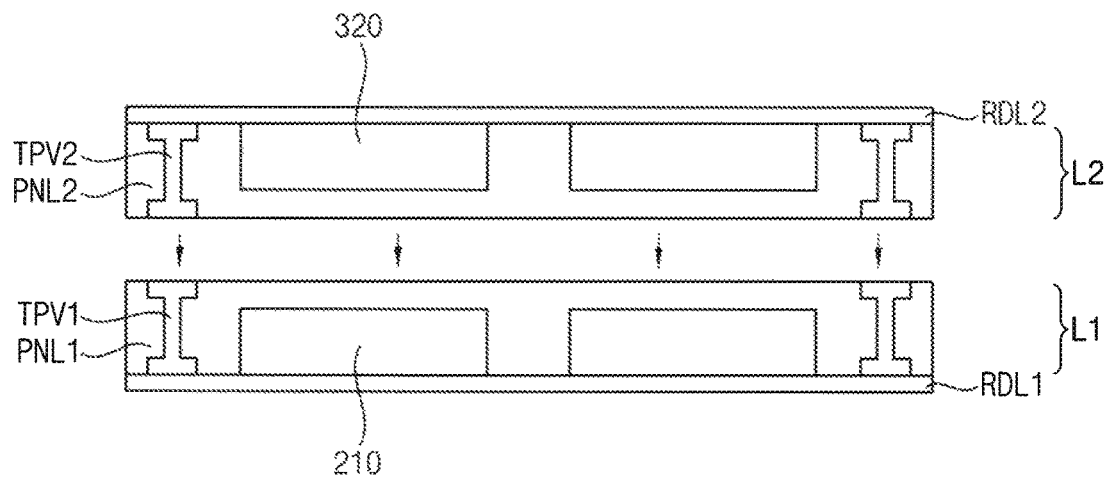
Figure 22D:
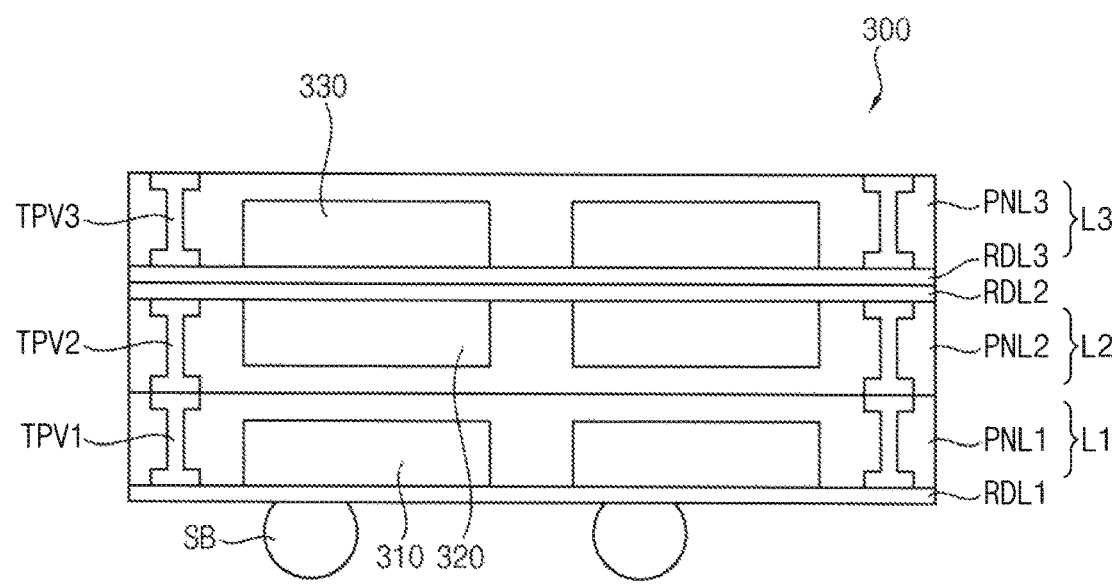
Figure 22D:

FIG. 19 is a flowchart illustrating a method of manufacturing a semiconductor package according to example embodiments. FIGS. 20A, 20B, 20C, and 20D are cross-sectional views illustrating a method of manufacturing the semiconductor package 100 of FIG. 1.

Referring to FIGS. 19, and 20A to 20D, the method of manufacturing the semiconductor package may include forming a first layer S100, stacking a second layer S200, stacking a third layer S300, and connecting an external connection terminal S400. The step S100 may include arranging a die and a via in the first layer S110, and forming a first redistribution layer S120. The step S200 may include arranging a die and a via in the second layer S210, forming a second redistribution layer S220 and stacking the second layer on the first layer S230. The step S300 may include arranging a die and a via in the third layer S310, forming a third redistribution layer S320 and stacking the third layer on the second layer S330.

The semiconductor chips 110, 120 and 130 and the TPVs TPV1, TPV2 and TPV3 may be disposed on the first, second and second panels PNL1, PNL2 and PNL3 respectively to form first, second and third layers L1, L2 and L3 may be formed (S110, S210, S310). For example, each of the first, second and third panels PNL1, PNL2, PNL3 may be parts of different panels or may be different parts included in the same panel.

In some example embodiment, the first, second and/or third layers L1, L2 and L3 may be formed based on a wafer level package (WLP) process. In addition, in some example embodiments, the first, second and/or third layers L1, L2 and L3 may be formed based on a Panel Level Package (PLP) process.

In the present embodiment, TPVs TPV1, TPV2 and TPV3 are arranged in the first, second and third panels PNL1, PNL2, PNL3, but it is not limited thereto. That is, for example, the TPV may not be formed in the third panel PNL3.

In the present embodiment, the first receiving portion AC1 may be formed through a cavity creation process for the first panel PNL1. After the first receiving portion AC1 is formed, the first semiconductor chip 110 may be disposed in the first receiving portion AC1. The first semiconductor chip 110 may have a first surface F1 on which the first to third pads are exposed.

And then, the first, second, and third redistribution layers RDL1, RDL2, and RDL3 may be formed on the first, second, and third layers L1, L2, and L3, respectively (S120, S220, and S320). For example, the first, second and third redistribution layers RDL1, RDL2 and RDL3 may be formed through various deposition processes such as sputtering, electrolytic plating, electroless plating or printing.

And then, the second layer L2 on which the second redistribution layer RDL2 is formed may be stacked on the first redistribution layer RDL1 (S230), and the third layer L3 may be stacked on the second redistribution layer RDL2 (S330).

And then, the semiconductor package 100 may be manufactured by bonding the solder balls, which are the external connection terminals SB, to the first TPV TPV1. (S400)

FIGS. 21A, 21B, 21C, and 21D are cross-sectional views illustrating a method of manufacturing the semiconductor package 200 of FIG. 10.

Referring to FIGS. 21A to 21D, the method of manufacturing the semiconductor package 200 is substantially same as the method of FIGS. 19 and 20A to 20D, except for a position at which the external contact terminal SB is joined and a direction in which the first, second and third layers L1, L2, L3 are stacked. Therefore, repeated descriptions will be omitted.

The second layer L2 on which the second redistribution layer RDL2 is formed may be stacked on the first layer L1 on which the first redistribution layer RDL1 is formed (S230), and the third layer L3 may be stacked on the second layer L2. (S330)

Solder balls, which is the external connection terminals SB, may be bonded to the first redistribution layer RDL1. (S400)

FIGS. 22A, 22B, 22C, and 22D are cross-sectional views illustrating a method of manufacturing the semiconductor package 300 of FIG. 17.

Referring to FIGS. 22A to 22D, the method of manufacturing the semiconductor package 200 is substantially same as the method of FIGS. 21A to 21D, except for a stacking direction of a second layer L2. Therefore, repeated descriptions will be omitted.

The second layer L2 on which the second redistribution layer RDL2 is formed may be stacked on the first layer L1 on which the first redistribution layer RDL1 is formed (S230), and then the third layer L3 may be stacked on the second layer L2. (S330)

Solder balls, which is the external connection terminals SB, may be bonded to the first redistribution layer RDL1. (S400)

According to the semiconductor packages of the example embodiments, by a buffer of a semiconductor chip in a first layer, a load of the inside and a load of the outside of the semiconductor package are separated, so that an load applied to the semiconductor package may be distributed or reduced as compared with the case when no buffer exists between an external connection terminal and input/output pads of the semiconductor chips.

In addition, unlike a wire bonding package structure, the semiconductor package has a laminated structure of through vias, and multi-stacking is possible without increasing load since the load is distributed or reduced by the buffer of the semiconductor chip.

In addition, it is possible to appropriately design positions of the through vias and wiring structure of the redistribution layer for each layer so as not to use or use the buffer in the semiconductor chip, and thus a desired circuit can be constituted.

In addition, the number of buffers passing through the input/output pads of the semiconductor chip can be adjusted for each layer, so that delay difference for each layer can be reduced.

The present invention may be applicable to various devices and systems including system-on-a-chip and memory devices. Therefore, the present invention may be applied to a mobile phone, a smart phone, a personal digital assistant (PDA), a portable media player (PMP), a digital camera, a camcorder, a personal computer (PC), a server computer, a workstation, a notebook, a digital television (TV), a set-top box, a music player, Internet of Things (IoT) devices, virtual reality (VR) devices, augmented reality (AR) devices, and the like.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the inventive concept. Accordingly, all such modifications are intended to be included within the scope of example embodiments as defined in the claims.

What is claimed is:

1. A semiconductor package, comprising:
a first layer comprising a first semiconductor chip and a first through via;
a first redistribution layer disposed on a surface of the first layer, and comprising a first-first wiring and a second-first wiring;
a second layer comprising a second semiconductor chip, and stacked on the first layer; and
a second redistribution layer disposed on the second layer and comprising a first-second wiring and a second-second wiring, wherein the first semiconductor chip comprises a first-first buffer, and the first-first buffer is electrically connected between the first-first wiring and the second-first wiring,
wherein the first through via is electrically connected to the first-first wiring and an external connection terminal which is an input/output terminal, the first through via being provided directly between the first-first wiring and the external connection terminal,
wherein the first semiconductor chip comprises a first-first pad and a second-first pad,
wherein the first-first buffer is directly connected between the first-first pad and the second-first pad,
wherein the first-first wiring is directly connected to the first-first pad, and the second-first wiring is directly connected to the second-first pad,
wherein the second layer further comprises a second through via, and
wherein the second through via is directly connected to the second-first wiring of the first redistribution layer and the second-second wiring of the second redistribution layer.

2. The semiconductor package of claim 1, wherein the first semiconductor chip further comprises a third-first pad, and
wherein the second-first wiring is further connected to the third-first pad.

3. The semiconductor package of claim 2, wherein the first redistribution layer is disposed between the first layer and the second layer.

4. The semiconductor package of claim 2, wherein the first layer further comprises a first panel formed with a first receiving portion for receiving the first semiconductor chip, and
wherein the first through via is a through panel via (TPV) through the first panel.

5. The semiconductor package of claim 1, wherein the first semiconductor chip further comprises a second-first buffer, and
wherein the second-first buffer is electrically connected between the second-first wiring and the first-first wiring.

6. The semiconductor package of claim 5, wherein the first redistribution layer further comprises a third-first wiring,
wherein the first semiconductor chip further comprises a third-first buffer, and
wherein the third-first buffer is electrically connected between the second-first wiring and the third-first wiring.

7. The semiconductor package of claim 1,
wherein the first layer is disposed between the first redistribution layer and the second layer, and the external connection terminal is disposed on the first redistribution layer, and the first redistribution layer is disposed between the external connection terminal and the first layer.

8. The semiconductor package of claim 7, wherein the first-first wiring is electrically connected to the second-first wiring, and
wherein the second-first wiring is electrically connected to the first through via.

9. The semiconductor package of claim 8,
wherein the second semiconductor chip comprises a first-second buffer, a first-second pad, and a second-second pad, and a third-second pad,
wherein the first-second buffer is electrically connected between the first-second pad and the second-second pad,
wherein the first-second wiring is electrically connected to the first-second pad, and the second-second wiring is electrically connected to the second-second pad and the third-second pad, and
wherein the first through via is electrically connected to the second-second wiring, and
wherein the second redistribution layer is disposed between the first layer and the second layer.

10. The semiconductor package of claim 8,
wherein the second semiconductor chip comprises a first-second buffer, a first-second pad, a second-second pad, and a third-second pad,
wherein the first-second buffer is electrically connected between the first-second pad and the second-second pad,
wherein the first-second wiring is electrically connected to the first-second pad, and the second-second wiring is electrically connected to the second-second pad and the third-second pad,
wherein the first through via is electrically connected to the second through via, and the second through via is electrically connected to the first-second wiring, and
wherein the second layer is disposed between the second redistribution layer and the first layer.

11. The semiconductor package of claim 10, wherein the first through via is directly connected to the second through via.

12. The semiconductor package of claim 1, further comprising:
a panel disposed between the external connection terminal and the first layer;
a third semiconductor chip disposed on the panel; and
a molding layer covering the third semiconductor chip, and
wherein the third semiconductor chip comprises a memory controller for controlling the first and second semiconductor chips.

13. The semiconductor package of claim 1, wherein the first through via and the second through via are located at different positions on a plane not to overlap each other.

14. The semiconductor package of claim 1, wherein the first-first buffer is a bidirectional buffer.

15. The semiconductor package of claim 1, wherein the first semiconductor chip of the first layer and the second semiconductor chip of the second layer are substantially the same.

16. The semiconductor package of claim 1, wherein the first layer further comprises a first panel having a first receiving portion to receive the first semiconductor chip, and
wherein the first through via is a through panel via (TPV) or a through silicon via (TSV) penetrating the first panel.

17. A semiconductor package comprising a plurality of layers,
wherein two or more of the plurality of layers comprise respective semiconductor chips, insulated from one another, and redistribution layers respectively disposed on the semiconductor chips,
wherein each semiconductor chip comprises two or more pads connected to one another by a plurality of wirings included in a corresponding redistribution layer, one of the two or more pads being an input/output pad of a corresponding semiconductor chip and the two or more pads respectively being directly connected to a wiring among the plurality of wirings, wherein a first-first wiring included in a first redistribution layer disposed on a first layer, among the plurality of layers, is configured to be connected to an external input/output terminal, wherein the first layer comprises a first through via penetrating the first layer, the first through via being electrically connected to a first-first wiring layer and the external input/output terminal and provided directly between the first-first wiring and the external input/output terminal, and wherein the first redistribution layer further comprises a second-first wiring, directly connected to the input/output pad of a first semiconductor chip included in the first layer, and at least one buffer connecting the first-first wiring and the second-first wiring by being directly disposed therebetween, wherein a second layer among the plurality of layers comprises a second through via penetrating the second layer to directly connect one of the first-first wiring and the second-first wiring in the first redistribution layer to a second-second wiring included in a second redistribution layer disposed on the second layer and directly connected to the input/output pad of a second semiconductor chip.

18. The semiconductor package of claim 17, wherein the second redistribution layer further comprises a first-second wiring and at least one buffer connecting the first-second wiring and the second-second wiring by being disposed therebetween.

19. A semiconductor package comprising a plurality of layers which are vertically stacked, wherein two or more of the plurality of layers comprise respective semiconductor chips, insulated from one another, and redistribution layers respectively disposed on the semiconductor chips, wherein each of the respective layers comprises a plurality of wirings and a same number of buffers connecting the plurality of wirings, the buffers respectively being directly disposed between two of the plurality of wirings included in a layer among the plurality of layers, wherein the plurality of wirings are connected to a pad included in a corresponding semiconductor chip of a corresponding layer, wherein a first-first wiring included in a first redistribution layer disposed on a first layer, among the plurality of layers, is configured to be connected to an external input/output terminal, and wherein the first layer comprises a first through via penetrating the first layer, the first through via being electrically connected to a first-first wiring layer and the external input/output terminal and provided directly between the first-first wiring layer and the external input/output terminal, wherein the first redistribution layer further comprises a second-first wiring and at least one buffer connecting the first-first wiring and the second-first wiring by being directly disposed therebetween, wherein a second-second wiring included in a second redistribution layer disposed on a second layer, among the plurality of layers, is configured to be connected to the second-first wiring, and wherein the second layer comprises a second through via penetrating the second layer, the second through via being electrically connected to a second-first wiring layer and the second-first wiring and provided directly between the second-first wiring and the second-second wiring.

* * * * *